(12) United States Patent
Maebara et al.

(10) Patent No.: US 7,586,726 B2
(45) Date of Patent: Sep. 8, 2009

(54) SWITCHING ELEMENT OVERCURRENT PROTECTION CIRCUIT WHICH OPERATES WITHIN A HIGH-VOLTAGE SYSTEM THAT INCORPORATES THE SWITCHING ELEMENT

(75) Inventors: Tsuneo Maebara, Nagoya (JP); Ryousuke Inoshita, Aichi-ken (JP); Kenichi Oohama, Ichinomiya (JP); Daisuke Ishiura, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/877,074

(22) Filed: Oct. 23, 2007

(65) Prior Publication Data
US 2008/0100978 A1    May 1, 2008

(30) Foreign Application Priority Data
Oct. 25, 2006   (JP)   ............................. 2006-289410
Mar. 23, 2007   (JP)   ............................. 2007-077247

(51) Int. Cl.
H02H 5/04   (2006.01)
(52) U.S. Cl. ....................... 361/93.8; 361/23
(58) Field of Classification Search ............. 361/23, 361/93.7–93.9
See application file for complete search history.

(56) References Cited

U.S. PATENT DOCUMENTS

| | | | | |
|---|---|---|---|---|
| 4,937,697 | A | * | 6/1990 | Edwards et al. ................ 361/18 |
| 5,119,265 | A | * | 6/1992 | Qualich et al. .............. 361/103 |
| 5,237,262 | A | * | 8/1993 | Ashley et al. ................ 323/284 |
| 6,842,064 | B2 | | 1/2005 | Yamamoto |

FOREIGN PATENT DOCUMENTS

| | | |
|---|---|---|
| JP | 3367699 | 11/2002 |
| JP | 2004-312924 | 11/2004 |

* cited by examiner

Primary Examiner—Danny Nguyen
(74) Attorney, Agent, or Firm—Nixon & Vanderhye P.C.

(57) ABSTRACT

A circuit for detecting excessive current flow through a switching element derives an electrical quantity relating to a condition of the switching element and correlated with the current level, and compares the magnitude of that electrical condition quantity with a threshold value corresponding to the maximum allowable level of current. A temperature detection signal indicative of the switching element temperature is converted to a compensation signal having a temperature characteristic which is modified from that of the temperature detection signal, and which is utilized to compensate the magnitude comparison operation against inaccuracy caused by a temperature dependency of the electrical condition quantity.

18 Claims, 15 Drawing Sheets

SWITCHING ELEMENT OVERCURRENT PROTECTION CIRCUIT WHICH OPERATES WITHIN A HIGH-VOLTAGE SYSTEM THAT INCORPORATES THE SWITCHING ELEMENT

CROSS-REFERENCE TO RELATED APPLICATIONS

This application is based on and incorporates herein by reference Japanese Patent Application No. 2007-077247 filed on Mar. 23, 2007 and Japanese Patent Application No. 2006-289410 filed on Oct. 25, 2006.

BACKGROUND OF THE INVENTION

1. Field of Application

The present invention relates to an overcurrent detection circuit for judging whether an excessive level of current is flowing between the input and output terminals of a switching element.

2. Description of Related Art

An example of such an overcurrent detection circuit is described in Japanese Patent No. 3367699, referred to in the following as reference document 1. With the overcurrent detection circuit of reference document 1, judgement of the level of current flowing between the collector and emitter of an IGBT (insulated gate bipolar transistor) is made based on a correlation between the collector-emitter voltage and the level of current. That is to say, the collector-emitter voltage is used as an electrical condition quantity, whose magnitude is compared with a predetermined threshold value for judging whether the level of transistor current is excessive.

However the collector-emitter voltage of an IGBT is temperature-dependent, so that at any specific value of transistor current, the collector-emitter voltage will vary in accordance with the temperature of the transistor. With the circuit proposed in reference document 1, a thermistor is disposed close to the IGBT. An output voltage obtained from the thermistor is converted to digital data by an A/D converter, to obtain data indicative of the temperature of the IGBT, with these data being inputted to a microcomputer. Based on the input data, the microcomputer calculates an appropriate threshold voltage value (i.e., compensated threshold value), and the electrical condition quantity (collector-emitter voltage) is compared with that compensated threshold value. Ideally, the compensated threshold value is a voltage having a temperature dependency which is identical to that of the collector-emitter voltage of the IGBT.

In that way an accurate judgement of the transistor current can be made based on the collector-emitter voltage, irrespective of the temperature at which the IGBT is operating.

However such a configuration presents various problems. There is a delay in converting the thermistor output into digital data, and a further delay in calculating the compensated threshold value by the microcomputer. In addition, due to the need to use an A/D converter and a microcomputer, the overall circuit scale is large and complex. Furthermore, in the case of an IGBT that is utilized in a DC-DC inverter coupled to control an electric motor in a vehicle, the inverter may be incorporated in a high-voltage electrical system whereas in general a microcomputer operates within a low-voltage electrical system. Hence when signals are to be transferred to the microcomputer from within the DC-DC inverter, it is necessary to transfer the signals through electrically insulating devices such as photo-couplers.

The above problems are not limited to the case of an overcurrent detection circuit, but arise in general when it is necessary to detect a condition of excessive current flow between the terminals of a switching element within a high-voltage system.

SUMMARY OF THE INVENTION

It is an objective of the present invention to overcome the above problems, by providing an overcurrent detection circuit whereby a judgement can be accurately made as to whether excessive current is flowing between the terminals of a switching element, with the overcurrent detection circuit having a simple circuit configuration, and which is applicable to switching elements that are incorporated in circuits which operate at a high voltage, while eliminating a need to utilize electrical isolation devices such as photo-couplers for signal transfer between a high-voltage system and a low-voltage system.

To achieve the above objectives, the invention provides an overcurrent detection circuit for detecting when the level of a switched current that flows between input and output terminals of a switching element exceeds a predetermined value, with the circuit comprising:

a condition detection circuit, which derives a condition detection signal based on an electrical condition quantity which has a predetermined correlation with the switched current, a judgement circuit for comparing the condition detection signal with a comparison threshold value, to judge when the overcurrent condition is occurring, and a temperature detection circuit adapted to produce a temperature detection signal which varies in response to variation of the temperature of the switching element.

In general, such a condition detection signal will vary in level with variations in the operating temperature of the switching element, even if the switched current remains constant. For that reason, an overcurrent detection circuit according to the present invention is characterized by incorporating an analog circuit which converts the temperature detection signal to an output signal that varies with changes in temperature of the switching element, but has a temperature variation characteristic that is modified from that of the temperature detection signal.

By applying an appropriate amount of DC offset, The analog circuit output signal can be used as a temperature-compensated comparison threshold value, i.e., which varies with the temperature of the switching element in the same manner as the condition detection signal, so that the result of comparison with the condition detection signal will be unaffected by changes in the temperature of the switching element.

Alternatively, (with a fixed comparison threshold value being used) the analog circuit output signal can be used to modify the condition detection signal, for obtaining a compensated condition detection signal which is substantially unaffected by changes in the temperature of the switching element, and so is suitable for comparison with the fixed threshold value.

In either case, the effect is to compensate the comparison operation (for judging whether the switched current being passed by the switching element exceeds a predetermined threshold value) against the temperature dependency of the condition detection signal. Hence, the judgement circuit can obtain a result that is independent of the temperature of the switching element.

Furthermore in general, for example when a temperature sensing diode is used as a temperature sensor for detecting the temperature of the switching element, so that the temperature detection signal is derived from the diode voltage, the temperature variation characteristic of the temperature detection signal will differ substantially from the temperature variation characteristic of the condition detection signal. In particular, the temperature variation characteristic of the temperature detection signal may increase in accordance with increasing temperature, when it is necessary for the level of the analog circuit output signal to decrease in accordance with increasing temperature. Alternatively, the slope of the temperature variation characteristic of the temperature detection signal may differ substantially from that of the condition detection signal, or may increase non-linearly.

For that reason, the analog circuit of the present invention modifies the temperature variation characteristic of the temperature detection signal, in the process of conversion Lo an output signal, to obtain a predetermined requisite form of temperature variation characteristic for the analog circuit output signal (where the "temperature variation characteristic" is the variation characteristic of the analog circuit output signal level with respect to the temperature of the switching element).

The modification may consist only of altering the slope (rate of increase in level with increasing temperature) of the temperature detection signal.

Alternatively, the analog circuit may convert the temperature variation characteristic of the temperature detection signal to exponential form, to obtain a temperature characteristic for the analog circuit output signal which will more closely match that of the condition detection signal, or match the inverse of that temperature variation characteristic, as required.

In either case, the analog circuit applies a specific amount of DC voltage offset when conversion from the temperature detection signal is performed, in order to obtain an appropriate temperature variation characteristic for the analog circuit output signal.

To invert the direction of change of the temperature variation characteristic (e.g., as required when the level of the temperature detection signal increases in accordance with increasing temperature of the switching element while the analog circuit output signal is required to decrease in accordance with increasing temperature), the temperature detection signal may be transferred through an inverting amplifier circuit.

Preferably, such an inverting amplifier circuit comprises an operational amplifier circuit having a first resistor connected between its output terminal and inverting input terminal for applying negative feedback, and a second resistor connected between the inverting input terminal and the source of the temperature detection signal, with the analog circuit output signal being produced from the output terminal of the operational amplifier. Hence if the temperature detection signal decreases with increasing temperature (as is the case with a temperature sensing diode used as a temperature sensor, for example), the level of the analog circuit output signal will increase with increasing temperature of the switching element.

Thus, if the condition detection signal level increases with increasing temperature of the switching element, the analog circuit output signal can be utilized as the threshold voltage in the judgement circuit, to be compared with the condition detection signal. The effects of the temperature dependency of the condition detection signal can thereby be eliminated.

With such an inverter circuit, the slope of the temperature variation characteristic of the analog circuit output signal can be adjusted as required, by adjusting the ratio of values of the first and second resistors. Hence, the temperature variation characteristic of the output signal produced from the analog circuit can be made substantially similar to the temperature variation characteristic of the condition detection signal. In addition, by adjusting a potential applied to the non-inverting input terminal of the operational amplifier (e.g., a potential produced from a resistive voltage divider) an amount of DC offset of the analog circuit output signal can readily be set as required.

In that way, the analog circuit output signal can be made appropriate for use as a threshold value which will vary with temperature in the same manner as the condition detection signal. Hence, the operation of the judgement circuit will be unaffected by variations in the temperature of the switching element, since the temperature dependency of the condition detection signal is cancelled by the (ideally) identical temperature dependency of the analog circuit output signal.

Alternatively, to convert the temperature detection signal such that the analog circuit output signal has an exponential form of temperature variation characteristic, the analog circuit can comprise:

first and second transistors connected in common-emitter configuration;

a first operational amplifier circuit having its output terminal connected to the transistor emitters, with the base of the first transistor and the non-inverting input terminal of the first operational amplifier being connected to a common potential, the collector of the second transistor connected to the inverting input terminal of the first operational amplifier, and a first resistor connected between a DC voltage source and that inverting input terminal; and, a second operational amplifier circuit, having a second resistor connected between its output terminal and inverting input terminal, with the collector of the first transistor being connected to that inverting input terminal.

As a result, if the temperature detection signal is applied to the base of the second transistor, the analog circuit output signal will be produced from the output terminal of the second operational amplifier circuit, and the level of the analog circuit output signal will decrease exponentially in accordance with increase of the temperature detection signal level.

Hence, if the temperature detection signal decreases linearly with increasing temperature of the switching element, the analog circuit output signal will increase exponentially with increasing temperature.

By applying an appropriate DC potential to the non-inverting input terminal of the second operational amplifier circuit, a required amount of DC offset can be applied to the analog circuit output signal. In that way, the temperature variation characteristic of the analog circuit output signal can be shaped as required to accord with the temperature variation characteristic of the condition detection signal.

From another aspect of the invention, instead of utilizing the level of the analog circuit output signal as the threshold value for comparison with the condition detection signal as described above, with the analog circuit output signal and condition detection signal varying in the same direction with increasing temperature of the switching element, the analog circuit output signal can be combined with the condition detection signal for compensating against the temperature dependency of the condition detection signal.

In that case, a compensated condition detection signal is derived, which (ideally) varies only in accordance with changes in the switched current of the switching element, independently of the temperature of the switching element. Thus this compensated condition detection signal can be compared with a fixed threshold value, to judge whether the threshold level of switched current is being exceeded for the switching element. Such a compensated condition detection signal can be obtained by summing the analog circuit output signal and condition detection signal. In that case, it is necessary for the analog circuit to derive its output signal, by conversion of the temperature detection signal, such that the analog circuit output signal and the condition detection signal vary in respectively opposite directions with increasing temperature of the switching element.

The above features and other features of the invention are set out in the following, referring to descriptions of preferred embodiments.

DESCRIPTION OF THE PREFERRED EMBODIMENTS

Figure 1:
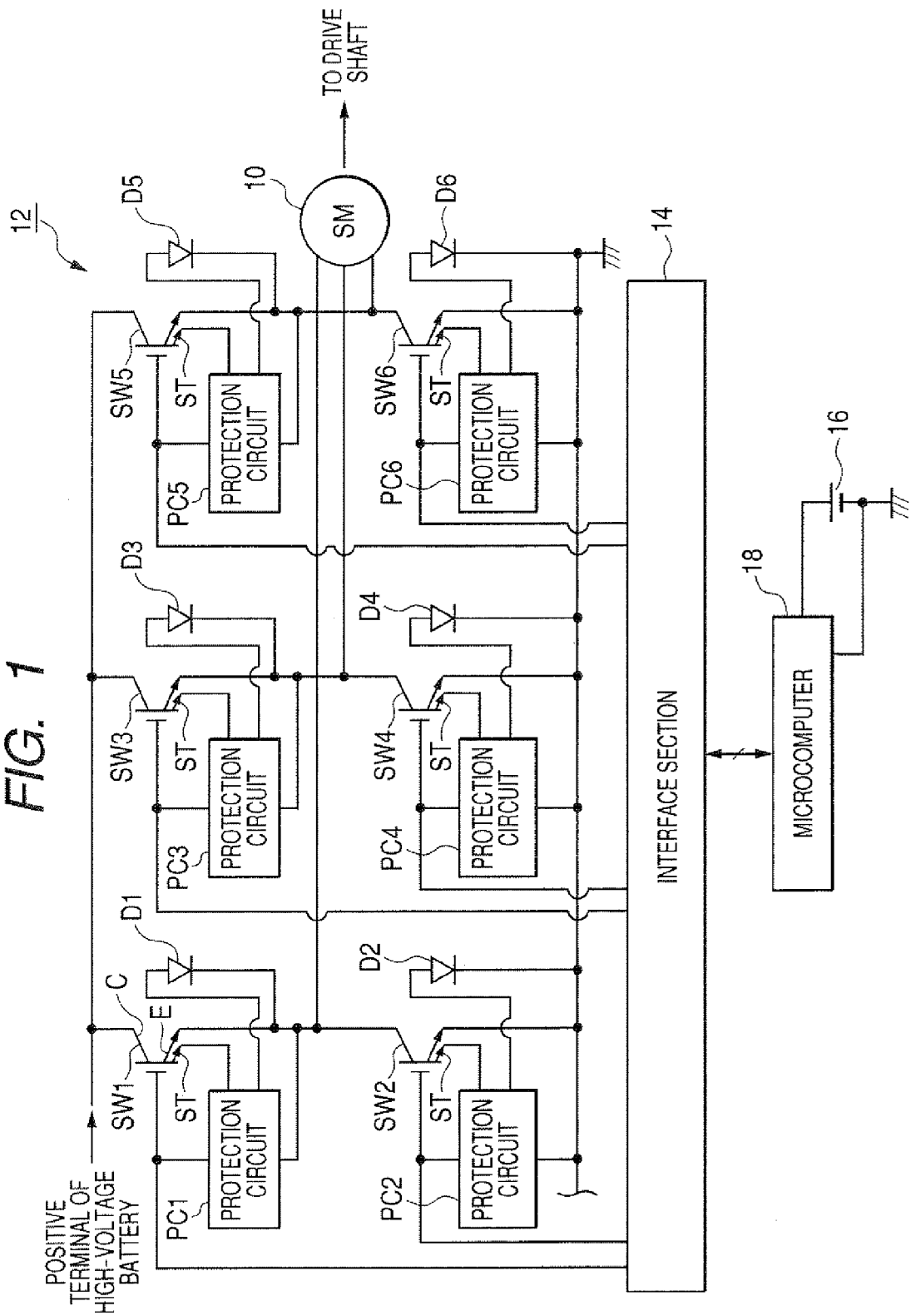
FIG. 1 is a general system block diagram showing the overall configuration of an electric motor control system incorporating a first embodiment of an overcurrent detection circuit.

FIG. 1 shows the overall circuit configuration of a control system for an electric motor, used in a hybrid type of motor vehicle. With such a vehicle, one or more electric motors are installed which operate from a high-voltage battery (where "high-voltage" here signifies a voltage substantially higher than the usual approximately 14 V of a vehicle battery). In the system of FIG. 1, numeral 10 denotes a 3-phase electric motor which is driven by power supplied from a 3-phase DC-to-AC power inverter, designated as inverter 12. As shown in FIG. 1, leads from the three (U, V, W) phase windings of the electric motor 10 are respectively connected to the junction of a first pair of series-connected switching elements SW1, SW2 (constituting a U-phase leg in the inverter 12), to the junction of a second pair of series-connected switching elements SW3, SW4 (constituting a V-phase leg), and to the junction of a third pair of series-connected switching elements SW5, SW6 (constituting a W-phase leg) of the inverter 12.

Each of the switching elements of this embodiment is an IGBT having a sensing terminal ST. When current flows from the collector to emitter of a switching element, a low-level current (sensing current) flows from the sensing terminal ST of that switching element, at a level which is substantially smaller than the current flow between the collector and emitter and which varies in proportion to the level of current flow between the collector and emitter. Each of the U-phase leg, V-phase leg and W-phase leg in the inverter 12 is connected across the high-voltage battery, as indicated.

The current which flows between the input and output terminals of a switching element (in this case, between collector and emitter), when the switching element is set in the conducting state, is referred to in the following as the "switched current" of the switching element.

Respective flywheel diodes (not shown in the drawings) are connected in parallel with each of the switching elements 1 to 6.

The switching elements SW1 to SW6 are controlled by signals produced from a microcomputer 18, transferred via an interface circuit 14. The microcomputer 18 operates from a low-voltage battery 16 as a power source.

A corresponding one of a set of temperature sensing diodes D1 to D6 is disposed close to each of the switching elements SW1 to SW6, for detecting the temperature of the corresponding switching element. In addition, each of the switching elements SW1 to SW6 is coupled to a corresponding one of a set of protection circuits PC1 to PC6 as shown in FIG. 1. When the level of current flow through a switching element reaches a predetermined threshold value, the corresponding protection circuit operates to control the current to maintain a value that is below the threshold value. To perform this, each of the protection circuits PC1 to PC6 receives the aforementioned low-level current that is produced from the sensing terminal ST of the corresponding one of the switching elements SW1 to SW6, and in addition, is coupled to the corresponding one of the temperature sensing diodes D1 to D6, for acquiring a voltage developed across that diode as described hereinafter. Based on these voltage and current inputs, the protection circuit judges whether the level of current through the corresponding switching element exceeds the threshold value, and if so, applies a voltage to the gate (i.e., control electrode) of the corresponding switching element, at a value for reducing the level of current flow between the collector and emitter of that switching element.

It is possible to configure the apparatus such that each protection circuit reduces the level of switched current through the corresponding switching element to zero, or to become no greater that the threshold value of current, when the threshold value of switched current is detected as being reached for that corresponding switching element.

Figure 2:
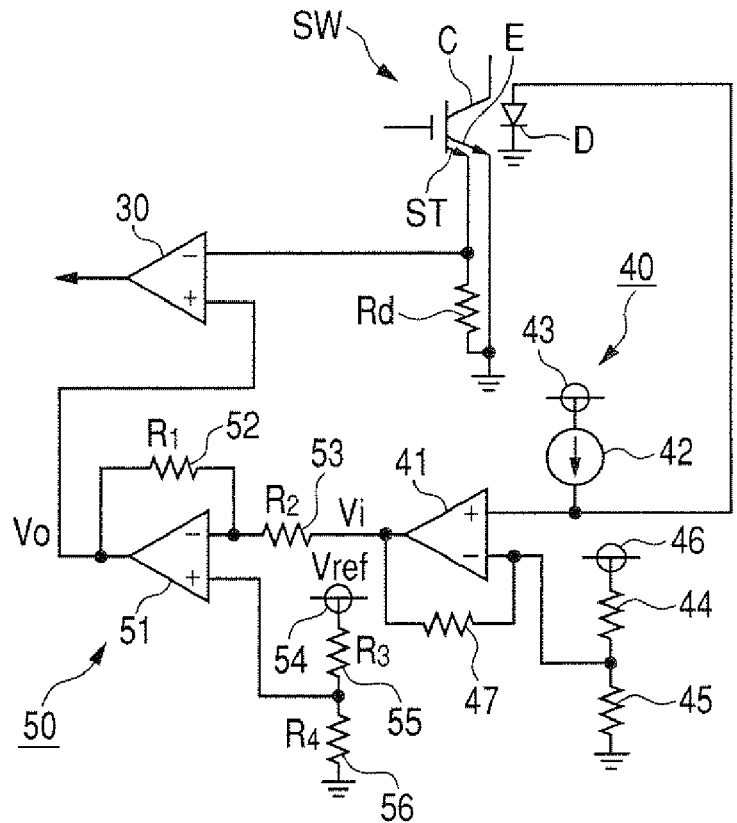
FIG. 2 is a circuit diagram of the first embodiment of an overcurrent detection circuit.

A specific section within each of the protection circuits PC1 to PC6, which has a function of detecting whether or not the threshold value of current has been reached by the corresponding switching element, will be described in the following, with that section being referred to as the overcurrent detection circuit of the protection circuit. A first embodiment of an overcurrent detection circuit, for use in each of the protection circuits PC1 to PC6 of the inverter 12 of FIG. 1, will be described referring to the circuit diagram of FIG. 2. In FIG. 2, SW designates any one of the switching elements SW1 to SW6, while D designates the corresponding temperature sensing diode, located close to the switching element SW. The sensing terminal ST of the switching element SW is connected via a resistor Rd to the emitter of the switching element SW. The emitter potential of the switching element SW constitutes a common reference (ground) potential of the corresponding one of the protection circuits PC1 to PC6, and so is indicated as ground potential in the drawings of overcurrent detection circuits.

The flow of current from the sensing terminal ST results in a voltage drop across the resistor Rd, referred to as the current detection voltage drop in the following. With this and other embodiments described herein, the current detection voltage drop constitutes an electrical condition quantity having a known correlation with the level of switched current of the corresponding switching element. In FIG. 2, the current detection voltage drop is inputted to the inverting input terminal of a comparator 30, with the magnitude of that voltage drop varying in accordance with the level of the switched current of the switching element SW.

With this embodiment, an output voltage signal Vo from an analog circuit (described hereinafter), is applied to the non-inverting input terminal of the comparator 30, with the level of that voltage signal constituting a threshold value for comparison with the current detection voltage drop. The resultant output from the comparator 30 indicates whether the switched current of the switching element SW exceeds the threshold value of current. If the threshold value of current is exceeded, the corresponding protection circuit applies a voltage to the base of the corresponding switching element (IGBT) for setting the switching element in the open-circuit condition, or setting the switched current at a level that does not exceed the threshold value, with this setting being performed by circuit elements not shown in the drawings.

Thus with this embodiment, by adjusting the level of the analog circuit output signal Vo appropriately (i.e., to correspond with the level that is attained by the voltage drop across the resistor Rd when the switched current reaches the threshold value of current), the comparator 30 can judge whether an excessive level of current is flowing in the switching element SW.

Figure 3:
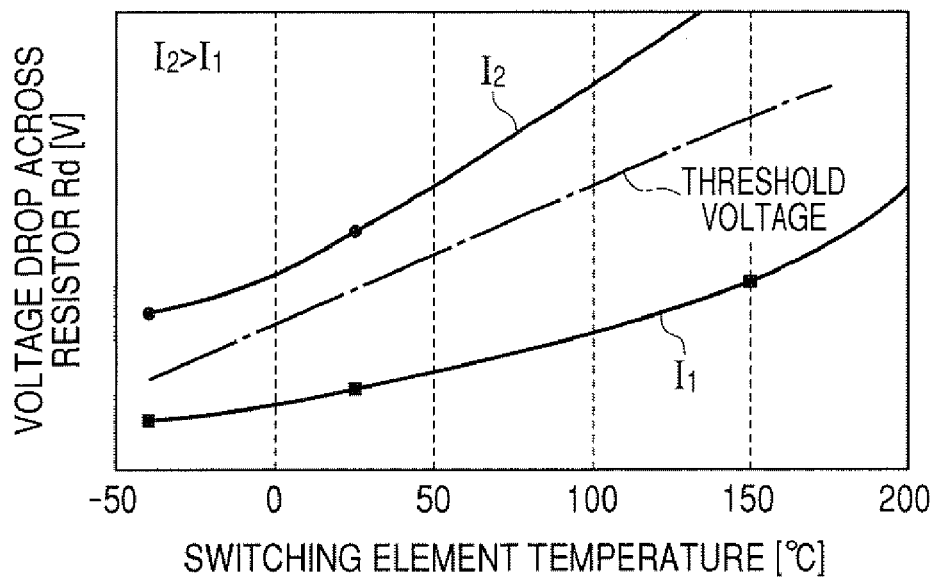
FIG. 3 shows graphs for illustrating the form of voltage/temperature characteristic of a voltage drop that is indicative of the level of current flow through a switching element in the control system of FIG. 1.

Assuming a condition in which the switched current of the switching element SW is held at a fixed value, the low-level current that flows from the sensing terminal ST will vary in accordance with the temperature of the switching element SW. Hence, the current detection voltage drop across the resistor Rd will correspondingly vary in accordance with these changes in temperature. This is illustrated in FIG. 3, showing examples of the relationship between the current detection voltage drop and temperature. In FIG. 3, the two full-line characteristics represent values of the current detection voltage drop for the case when the switched current of the switching element SW has a fixed value I2, and for the case when that current has the fixed value I1, where I2>I1. As shown, in each case, the magnitude of the current detection voltage drop increases in accordance with increasing temperature.

If it is assumed for example that an appropriate threshold value of current flow between the collector and emitter of the switching element SW is intermediate between the current values I2 and I1, then it can be understood that an appropriate temperature variation characteristic for a threshold voltage value (applied to the non-inverting input terminal of the comparator 30) for comparison with the current detection voltage drop will be approximately as shown by the broken-line characteristic in FIG. 3.

It can thus be understood that if the analog circuit output signal Vo of this embodiment is controlled to have a temperature variation characteristic which is close to that of the voltage drop across Rd, then the comparator 30 can be utilized to accurately judge whether the switched current of the switching element SW exceeds the threshold value of current. Such formation of an appropriate temperature variation characteristic is effected as described in the following.

The overcurrent detection circuit of FIG. 2 includes a gain adjustment circuit 40, in which a fixed level of current is passed through a temperature sensing diode D, while an output signal corresponding to the voltage of the temperature sensing diode D is outputted from the gain adjustment circuit 40, with that output signal being referred to in the following as the temperature detection signal Vi. The overcurrent detection circuit further includes an output conversion circuit 50, which is an analog circuit that receives the temperature detection signal Vi and performs conversion of that signal (as described hereinafter) to obtain the analog circuit output signal Vo, which is applied to the non-inverting input terminal of the comparator 30 as described above.

The cathode of the temperature sensing diode D is connected to the emitter of the switching element SW, i.e., to ground potential of the overcurrent detection circuit, as defined hereinabove. The anode of diode D is connected to the non-inverting input terminal of an operational amplifier 41 in the gain adjustment circuit 40 and also is connected to pass a fixed current that is supplied from a voltage source 43 via a constant-current source 42.

In the gain adjustment circuit 40, a resistive voltage divider is formed by resistors 44, 45 connected between a power source 46 and the reference potential, with the output voltage from the resistive voltage divider being applied to the inverting input terminal of the operational amplifier 41. A resistor 47 is connected between the output terminal and inverting input terminal of the operational amplifier 41.

Figure 4:
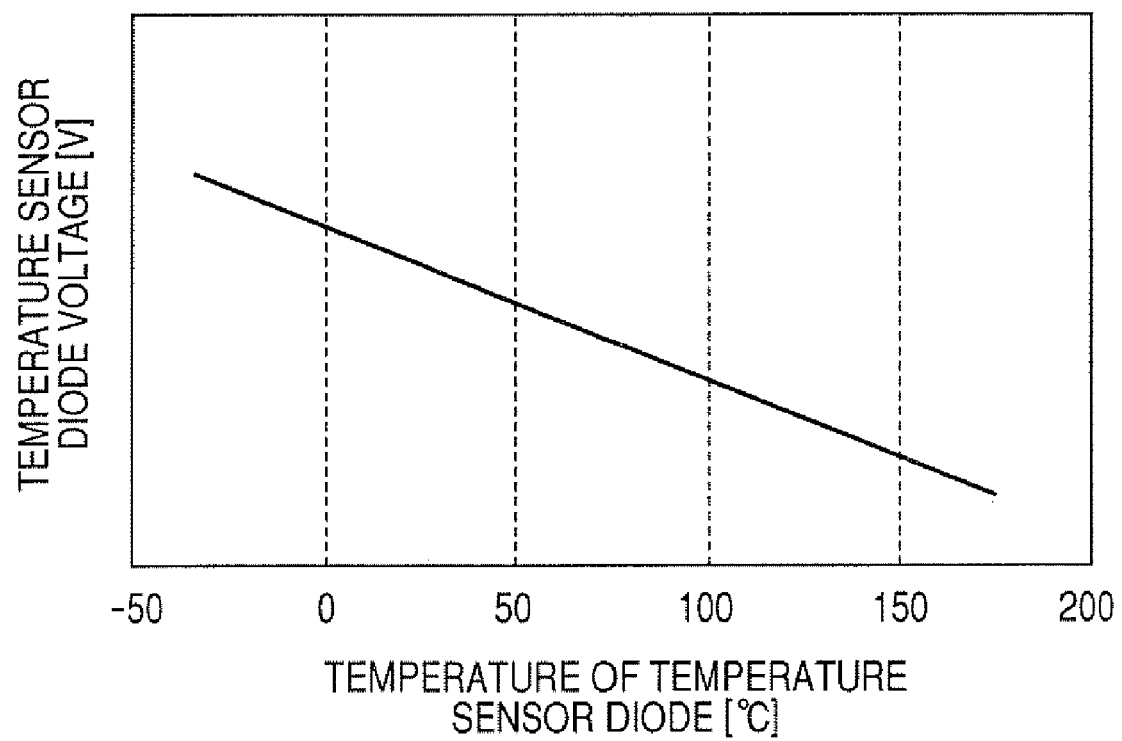
FIG. 4 is a graph illustrating the form of voltage/temperature characteristic of a temperature sensing diode used to detect the temperature of a switching element.

The temperature variation characteristic of the voltage of the temperature sensing diode D is illustrated in FIG. 4. As shown, the slope direction of that characteristic (and hence, of the temperature variation characteristic of the temperature detection signal Vi) is the inverse of the temperature variation characteristic of the voltage drop across the resistor Rd, shown in FIG. 3. Thus the temperature detection signal Vi decreases in level with increasing temperature, whereas the current detection voltage drop increases in level with increasing temperature. The function of the output conversion circuit 50 is to convert the temperature detection signal Vi to an output signal Vo having a temperature variation characteristic similar to that of the current detection voltage drop across the resistor Rd, while being at an appropriate threshold voltage level corresponding to the maximum allowable value of switched current of the switching element SW, as described above.

To set the temperature characteristic of the output signal Vo appropriately, the output conversion circuit 50 inverts the slope direction of the temperature variation characteristic of the temperature detection signal Vi, adjusts the slope of the inverted characteristic, and applies an offset voltage correction to the inverted characteristic. In that way, the output voltage from the temperature sensing diode D can be converted to obtain the analog circuit output signal Vo with a temperature variation characteristic of the form shown in FIG. 3, which increases in accordance with increasing temperature.

The analog circuit output signal Vo can thereby be obtained at a level and having a temperature variation characteristic as required for the comparison threshold voltage of the comparator 30.

In the output conversion circuit 50, an operational amplifier 51 has a resistor 53 connected between its inverting input terminal and the output of the operational amplifier 41, to receive the temperature detection signal Vi from the gain adjustment circuit 40. A resistor 52 is connected between the output terminal and inverting input terminal of the operational amplifier 51 to apply negative feedback. The analog circuit output signal Vo is produced from the output terminal of the operational amplifier 51, and applied to the non-inverting input terminal of the comparator 30. A resistive voltage divider is formed of resistors 55, 56, which receive a supply voltage from a reference voltage source 54, with the output voltage from the resistive voltage divider being applied to the non-inverting input terminal of the operational amplifier 51.

Designating the respective values of the resistors 52, 53, 55, 56 as R1, R2, R3 and R4, the output signal Vo from the output conversion circuit 50 can be expressed as follows:

$$Vo = Vi \times (-R1/R2) + Vref \times \{(R1+R2)/R2\} \times \{R4/(R3+R4)\} \quad (1)$$

Hence with this embodiment, the level of the analog circuit output signal Vo (i.e., the comparison threshold voltage level of the comparator 30) is proportional to the temperature detection signal Vi, with a proportionality factor of (−R/R2). Hence, the aforementioned inversion of the direction of the slope of the temperature variation characteristic of the output voltage from the temperature sensing diode D is achieved, by the signal inversion performed in the output conversion circuit 50. The slope can be adjusted by adjusting the ratio of the resistor values R1/R2.

In addition, by adjusting the values of the resistors R3, R4, the amount of DC offset voltage of the analog circuit output signal Vo can be set as required. In that way, Vo can be set to have a requisite temperature variation characteristic.

The effects obtained with the above embodiment can be summarized as follows:

(1) The output conversion circuit 50 performs an analog signal conversion operation on the temperature detection signal obtained from the voltage of the temperature sensing diode D, to thereby obtain the analog circuit output signal Vo as a voltage signal having a temperature variation characteristic that is close to the required threshold value temperature characteristic shown in FIG. 3. Hence, Vo can be used as a threshold value for comparison with the voltage drop across the resistor Rd, with the accuracy of comparison being substantially unaffected by changes in temperature of the switching element SW.

Thus for example (with a fixed current flowing between the collector and emitter of the switching element SW) if the voltage of the temperature sensing diode D decreases due to an increase in temperature, the output signal Vo will increase by an amount that is substantially identical to a corresponding increase in the voltage drop across the resistor Rd that results from the temperature dependency of the sensor current produced from the switching element SW, i.e., the temperature dependency of the electrical condition quantity of this embodiment.

(2) The output conversion circuit 50 includes an operational amplifier 51 having a resistor 53 connected between its inverting input terminal and the output of the gain adjustment circuit 40, and a resistor 52 connected between its output terminal and inverting input terminal for applying negative feedback. Hence, the rate of change of the temperature detection signal Vi with respect to changes in temperature of the switching element SW (i.e., slope of the temperature variation characteristic) can be converted as required to obtain the analog circuit output signal Vo, by selecting appropriate values for the resistors 52, 53.

(3) The voltage from a reference voltage source 54 is applied to a resistive voltage divider formed of resistors 55, 56, with the output voltage from the resistive voltage divider applied to the non-inverting input terminal of the operational amplifier 51 in the output conversion circuit 50. Hence the amount of voltage offset applied to the analog circuit output signal Vo can be adjusted as required, by adjusting the values of the resistors 55 and 56.

(4) By detecting a voltage drop resulting from the low-level current from the sensing terminal ST of the switching element SW, the level of current flow between the collector and emitter of the switching element SW can be readily detected.

(5) By using the temperature sensing diode D, the temperature of the switching element SW can be detected in a simple manner.

(6) Referring again to FIG. 1, overcurrent detection is applied to switching elements incorporated in a high-voltage system of the power inverter 12, which is connected to the electric motor 10. If the microcomputer 18 were to be used to perform such overcurrent detection, it would be necessary for signals to be transferred between the microcomputer 18 (operating in the low-voltage system) and the high-voltage system, using electrically isolated devices such as photocouplers. Such signals could for example convey the respective values of voltage drop occurring across the resistors Rd corresponding to the various switching elements.

However with the above embodiment, by configuring each of the protection circuits PC1 to PC6 as an analog circuit that is located within the high-voltage system (i.e., within the inverter 12), it becomes unnecessary to transfer such signals, so that devices such as photocouplers are not required.

Second Embodiment

Figure 5:
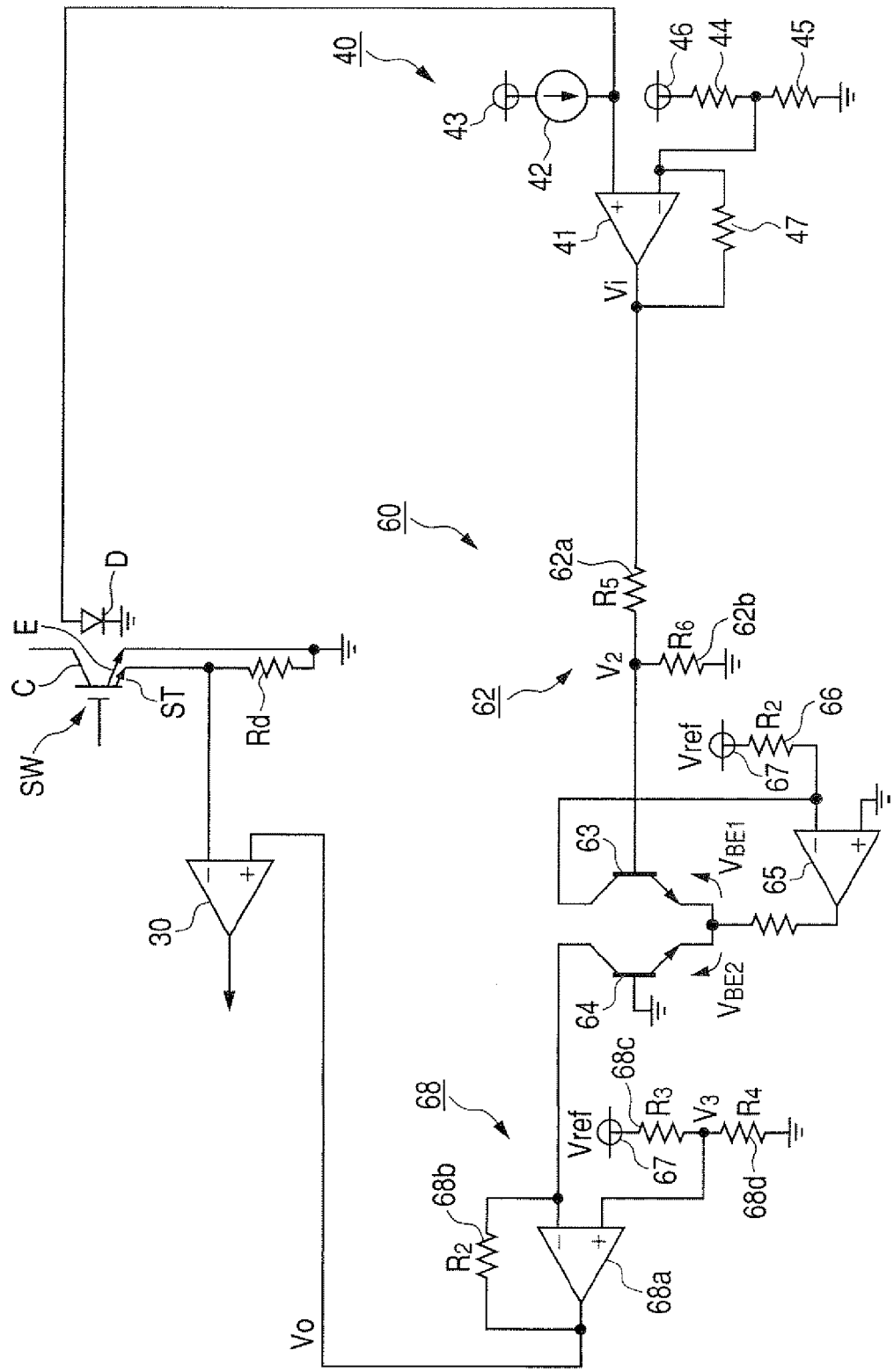
FIG. 5 is a circuit diagram of a second embodiment of an overcurrent detection circuit.

A second embodiment of an overcurrent detection circuit will be described in the following referring to the circuit diagram of FIG. 5, with the description being centered on the points of difference from the first embodiment. In FIG. 5, components corresponding to components in the first embodiment are designated by corresponding reference numerals to those of the first embodiment.

This embodiment incorporates an output conversion circuit 60, which performs conversion of the temperature detection signal Vi in place of the output conversion circuit 50 of the first embodiment. With the first embodiment, the output conversion circuit 50 converts an approximately linear temperature variation characteristic of a diode to a corresponding approximately linear temperature variation characteristic having an inverted slope direction (e.g., as shown for the threshold voltage in FIG. 3), with the slope and DC voltage offset amount of that characteristic being adjusted appropriately. However as can be understood from FIG. 3, in general the voltage drop across the resistor Rd varies non-linearly with temperature, so that the optimum temperature variation characteristic for the threshold voltage applied to the comparator 30 may also be non-linear.

Thus it is preferable that the analog circuit output signal Vo also has a similar non-linear temperature variation characteristic, to achieve greater accuracy of overcurrent detection. With the second embodiment, the output conversion circuit 60 produces the analog circuit output signal Vo to increase exponentially in accordance with decrease of the level of the temperature detection signal Vi, while also applying an appropriate amount of DC offset to Vo. Hence, an appropriate non-linear temperature variation characteristic can be established for the analog circuit output signal Vo, which can thereby more accurately track changes in the voltage drop across the resistor Rd that result from temperature variations. The threshold voltage utilized for comparison by the comparator 30 can thereby be more accurately maintained at an appropriate value, irrespective of temperature variations of the switching element SW.

In the output conversion circuit 60, the temperature detection signal Vi from the gain adjustment circuit 40 is applied to a resistive voltage divider 62 formed of resistors 62a, 62b, with the resultant output voltage from the resistive voltage divider 62 being designated as V2. Designating the respective resistance values of the resistors 62a, 62b as R5 and R6, the value of the voltage V2 can be expressed as:

$$V2 = Vi \times R6/(R5+R6)$$

The voltage V2 is applied to the base of a transistor 63, which is one of a pair of transistors 62, 63 connected in common-emitter configuration as shown. The emitters of the transistors 62, 63 are connected via a resistor 69 to the output terminal of an operational amplifier 65, with the non-inverting input terminal of the operational amplifier 65 being connected to the potential of the emitter of the switching element SW (serving as the ground potential of the overcurrent detection circuit, as described above). The inverting input terminal of the operational amplifier 65 is connected to the collector of the transistor 63, and is also connected via a resistor 66 to a DC power source 67. The base of the transistor 64 is connected to the emitter potential of the switching element SW.

The collector of the transistor 64 is connected to the inverting input terminal of an operational amplifier 68a in a inverting amplifier circuit 68. A resistor 68b is connected between the output terminal and inverting input terminal of the operational amplifier 68a to apply negative feedback. The output voltage from a resistive voltage divider formed of resistors 68c, 68d, supplied from a reference voltage source 67, is applied to the non-inverting input terminal of the operational amplifier 68a. The output signal from the operational amplifier 68a constitutes the analog circuit output signal Vo from the output conversion circuit 60 of this embodiment.

Designating the values of each of the resistors 66, 68b as R2, the voltage of the power source 67 as Vref, and the respective base-emitter voltages of the transistors 63, 64 as VBE1, VBE2, these can be expressed as follows:

$$VBE1 = \alpha \times \log(Vref/R2 \times \beta 1)$$

$$VBE2 = \alpha \times \log\{(V0-V3)/R2 \times \beta 2)\}$$

In the above, $\alpha$, $\beta 1$ and $\beta 2$ are respective constants.

By inserting the above relationships for VBE1 and VBE2 into the equation $$-VBE2 = V2 - VBE1$$

the following can be obtained:

$$V2 = \alpha \times \log\{(Vref/R2 \times \beta 1) \times R2 \times \beta 2/(V0-V3)\}$$

If the transistors 63 and 64 are assumed to have identical characteristics, then $\beta 1 = \beta 2$, so that the following equation can be obtained:

$$V2 = \alpha \times \log\{Vref/(Vo-V3)\}$$

Hence, by expressing the output voltage V2 from the resistive voltage divider 62 in terms of the input voltage Vi, the following can be derived:

$$Vi \times R6/(R5+R6) = \alpha \times \log\{Vref/(Vo-V3)\}$$

By selecting respective values of resistance R5, R6 whereby the relationship $[\alpha = R6/(R5+R6)]$ is satisfied, the following equation can be obtained:

$$-Vi = \log\{(Vo-V3)/Vref\}$$

Thus the following can be obtained:

$$Vo = Vref \times 10^{-Vi} + V3$$

Hence there is an inverse exponential relationship between variations in the voltage Vi and resultant variations in the analog circuit output signal Vo from the output conversion circuit 60, with an amount of voltage offset equal to V3 being added to Vo.

Thus, the temperature variation characteristic of the analog circuit output signal Vo can be shaped to increase appropriately non-linearly in accordance with increases in temperature of the switching element SW, if the voltage drop across the resistor Rd increases non-linearly with such changes in temperature, for example as illustrated in FIG. 3 above.

Thus with the second embodiment, in addition to the effects (1) and (4) to (6) obtained with the first embodiment as described above, the following additional effect is obtained:

(7) The output conversion circuit 60 contains an operational amplifier having an output terminal connected to the common connection point of the emitters of the transistors 63 and 64, with the base of the transistor 64 connected to the same potential as that of the non-inverting input terminal of the operational amplifier 65. The collector of the transistor 63 is connected to the inverting input terminal of the operational amplifier 65, while a reference voltage Vref is applied via the resistor 66 to that inverting input terminal. As a result, variations in the output voltage Vt can be converted to an exponential form of variation, with the resultant voltage signal being obtained as the analog circuit output signal Vo of this embodiment. Hence, even if the voltage drop across the resistor Rd varies non-linearly with temperature, the analog circuit output signal Vo can be appropriately compensated against such variations.

Third Embodiment

Figure 6:
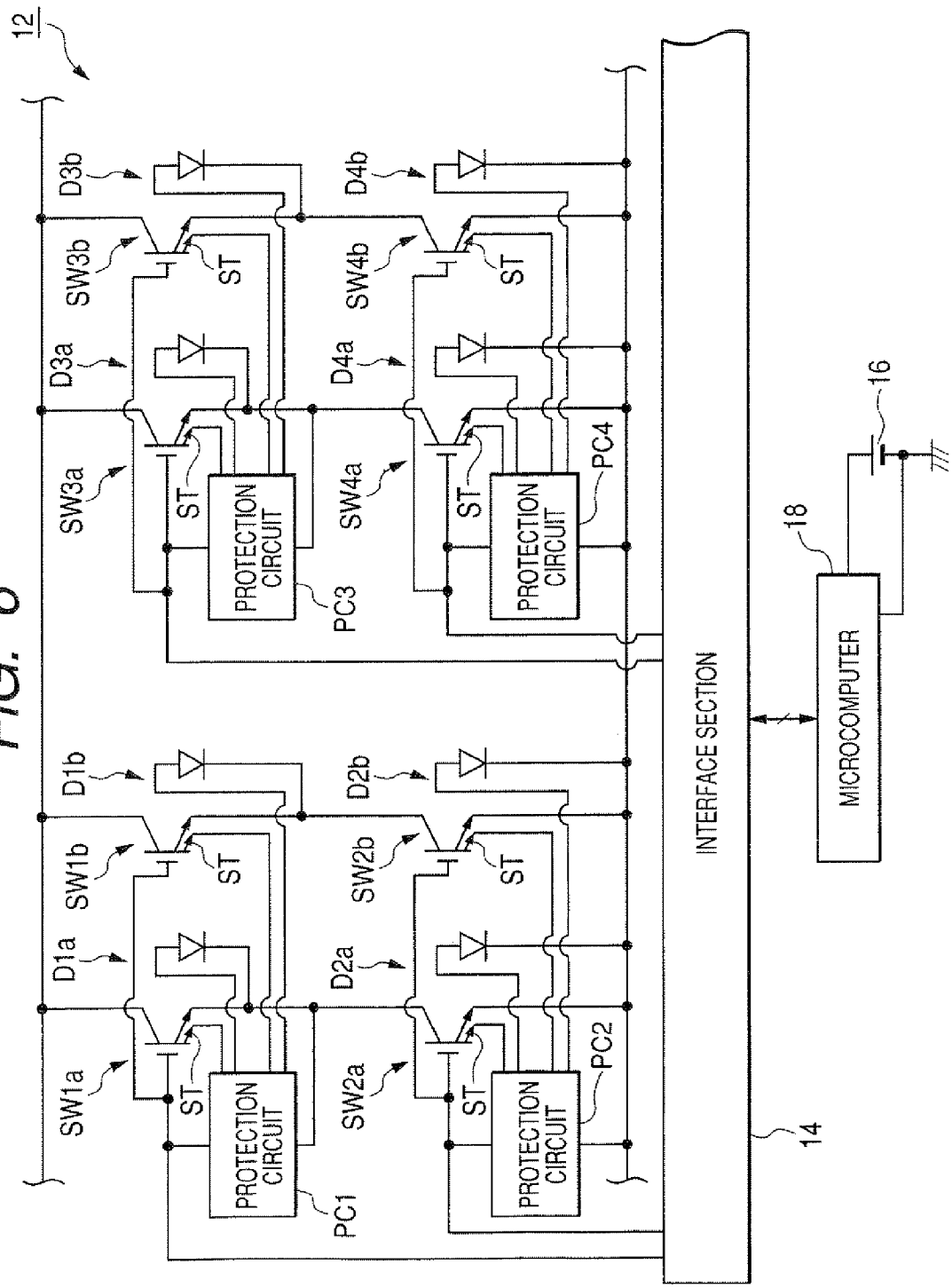
FIG. 6 is a general system block diagram showing the overall configuration of an electric motor control system incorporating a third embodiment of an overcurrent detection circuit.

A third embodiment of will be described in the following referring to the circuit diagram of FIG. 6, with the description being centered on the points of difference from the first embodiment. In FIG. 6, components corresponding to components shown in FIG. 1 are designated by corresponding reference numerals to those of FIG. 1.

With this embodiment as shown in FIG. 6, in each upper stage and each lower stage of each phase leg of the inverter 12, a pair of switching elements are connected in parallel. For example the switching elements SW1a, SW1b are connected in parallel in the upper stage of the U-phase leg, while the switching elements SW2a, SW2b are connected in parallel in the lower stage of that phase leg. This is done in order to enable the level of current that flows in each phase of the inverter 12 to be increased, while ensuring that the current that flows in each switching element is maintained within design specifications. With such a configuration, the switching elements of a parallel-connected pair are switched on and off in synchronism. For that reason, a part of each of the protection circuits PC1 to PC6 can be used in common for each switching element of such a parallel-connected pair. This is done by using the respective low-level currents from the sensing terminal ST of the switching elements of the pair, and the voltages of temperature sensing diodes located close to respective ones of the switching elements.

Figure 7:
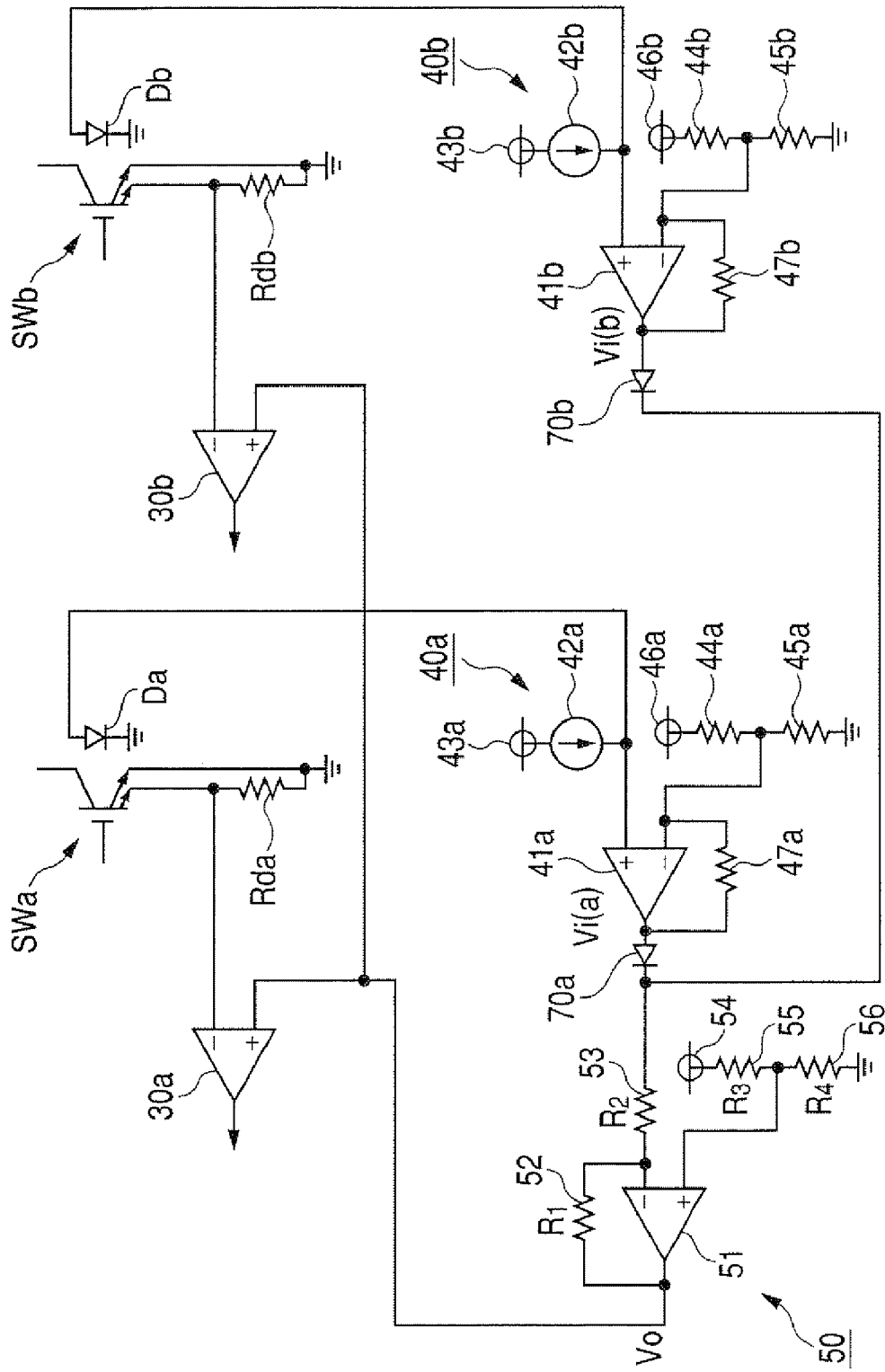
FIG. 7 is a circuit diagram of the third embodiment of an overcurrent detection circuit.

FIG. 7 shows the configuration of an overcurrent detection circuit, representative of each of respective overcurrent detection circuits that are incorporated in each of the protection circuits PC1 to PC6 of this embodiment (with only the protection circuits PC1 to PC4 being shown in the partial circuit diagram of FIG. 6). In FIG. 7, components corresponding to components shown in FIG. 2 above are designated by corresponding reference numerals to those of FIG. 2.

Referring to FIG. 7, the temperature sensing diodes Da, Db are respectively disposed close to the switching elements SWa, SWb. The switching elements SWa, SWb are assumed to have identical characteristics (i.e., identical dimensions, configuration, accuracy of manufacture, performance, etc.), and the pair of diodes Da, Db similarly have mutually identical characteristics.

Resistors Rda, Rdb respectively pass the low-level currents from the sensing terminal ST of the switching elements SWa, SWb, with the resultant voltage drops across these resistors being applied to the inverting input terminals of comparators 30a and 30b. However a single output conversion circuit 50 is used in common for both of the switching elements SWa, SWb, to produce a single analog circuit output signal Vo, which is applied in common to respective non-inverting input terminals of two comparators 30a, 30b.

The output signals from the temperature sensing diodes Da, Db are supplied to respective gain adjustment amplifiers 40a, 40b. Each of the gain adjustment amplifiers 40a, 40b has an identical configuration to that of the gain adjustment circuit 40 shown in FIG. 2 and described above, and have identical characteristics. Temperature detection signals Vi(a), Vi(b) which are respectively produced from the gain adjustment amplifiers 40a, 40b are supplied in common, via respective diodes 70a, 70b, to one terminal of the resistor 53, i.e., with the cathodes of the diodes 70a, 70b being connected to that terminal of the resistor 53, whose other terminal is connected to the inverting input terminal of the operational amplifier 51 as described for the first embodiment.

In that way, the gain adjustment amplifiers 40a, 40b and the diodes 70a, 70b function in combination as an analog OR circuit (maximum value circuit), whereby the output conversion circuit 50 acquires the temperature detection signal produced from the one of the gain adjustment amplifiers 40a, 40b corresponding to the one of the diodes Da, Db which is at the lower temperature of these two diodes, i.e., for which the corresponding temperature detection signal is the higher of the two temperature detection signals Vi(a), Vi(b). In that way, a temperature detection signal is selected which corresponds to the one of the switching elements SWa, SWb that is at the lower temperature of the two switching elements.

As described above referring to FIG. 4, the lower the temperature of a switching element SWa or SWb, the higher will be the output voltage from the corresponding temperature sensing diode Da or Db (and hence, the lower will be the level of an analog circuit output signal Vo that is derived from the voltage of that corresponding diode). With this embodiment, as a result of the analog OR circuit selecting the higher one of the output voltages from the temperature sensing diodes Da, Db, the output voltage from the diode which is at the lower temperature will be selected for deriving the analog circuit output signal Vo that determines the threshold voltage value for each of the comparators 30a, 30b. This enables attainment of the threshold value of current flow (maximum allowable switched current) through the switching elements SWa, SWb to be more readily detected.

Thus with the third embodiment, in addition to the effects (1) to (6) obtained with the first embodiment as described above, the following additional effect is obtained:

(8) As a result of utilizing the analog OR circuit made up of the gain adjustment amplifiers 40a, 40b and the diodes 70a, 70b, the threshold value is set by using the output voltage from the one of the temperature sensing diodes Da, Db which is located close to the one of the switching elements SWa, SWb that is at the lower temperature of the two switching elements. Hence, with the output conversion circuit 50 being used in common for both of the switching elements SWa, SWb, a reliable judgement can be made as to whether the level of current flowing in each of the switching elements SWa, SWb exceeds the predetermined threshold value.

Fourth Embodiment

Figure 8:
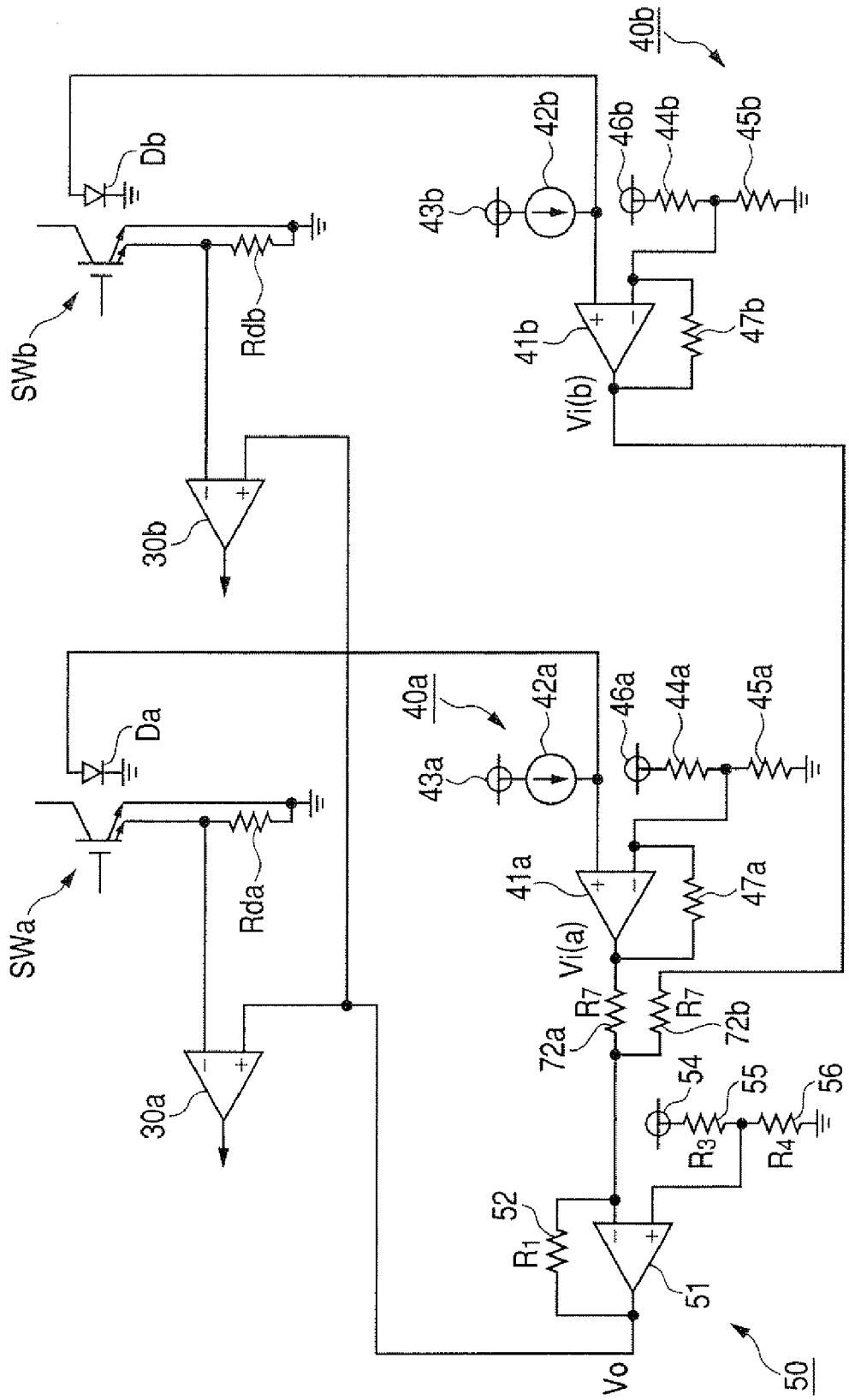
FIG. 8 is a circuit diagram of a fourth embodiment of an overcurrent detection circuit.

A fourth embodiment will be described in the following referring to the circuit diagram of FIG. 8, which shows an overcurrent detection circuit that is representative of each of respective overcurrent detection circuits incorporated in the protection circuits PC1 to PC6 of this embodiment, with the description being centered on the points of difference from the third embodiment described above. In FIG. 8S, components corresponding to components shown in FIG. 7 are designated by corresponding reference numerals to those of FIG. 7.

With this embodiment, the respective temperature detection signals Vi(a), Vi(b) outputted from the gain adjustment amplifiers 40a, 40b are applied through resistors 72a, 72b which are of identical value, to the inverting input terminal of the operational amplifier 51. As a results, an averaging circuit is constituted by the combination of the resistors 72a, 72b and the operational amplifier 51, whereby the output conversion circuit 50 sets the level of the analog circuit output signal Vo (i.e., the threshold voltage level of the comparators 30a, 30b) based on the average of the temperatures of the switching elements SWa, SWb, as expressed by the respective output voltages of the temperature sensing diodes Da, Db.

In that way, the output conversion circuit 50 of this embodiment can be used in common for the switching elements SWa, SWb, for judging whether currents flowing through the switching elements exceed the threshold value.

Fifth Embodiment

Figure 9:
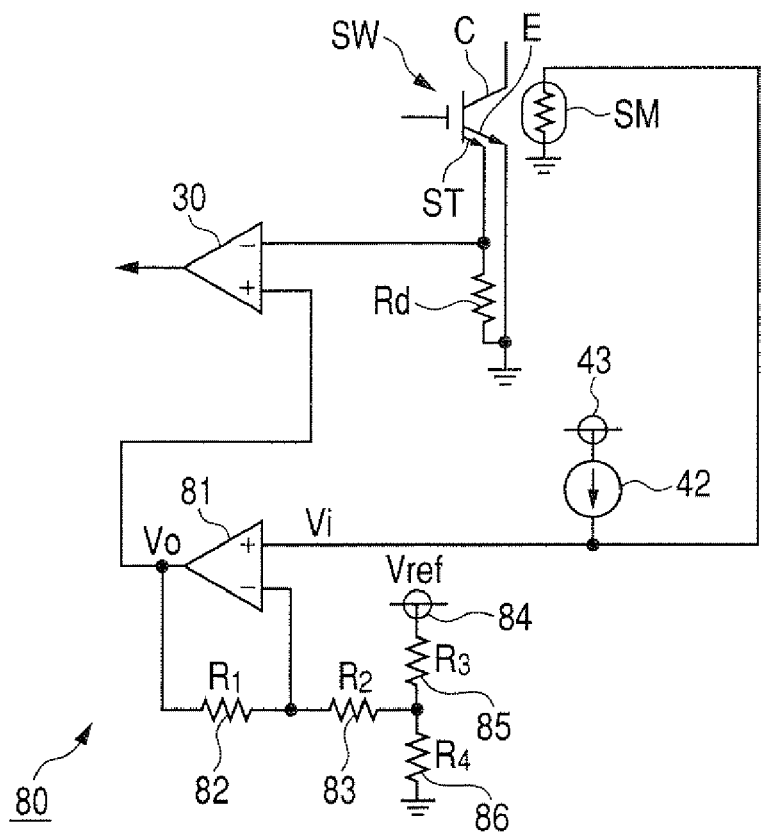
FIG. 9 is a circuit diagram of a fifth embodiment of an overcurrent detection circuit.

A fifth embodiment will be described in the following referring to the circuit diagram of FIG. 9, which shows an overcurrent detection circuit that is representative of each of respective overcurrent detection circuits incorporated in the protection circuits PC1 to PC6 of FIG. 1. The description is centered on the points of difference from the first embodiment described above. In FIG. 9 components corresponding to components shown in FIG. 2 are designated by corresponding reference numerals to those of FIG. 2.

This embodiment utilizes thermistors for detecting the temperatures of the switching elements SW, with each thermistor located close to a corresponding switching element SW. As shown in FIG. 9, a current is passed through a thermistor SM from a fixed current source 42, supplied from a power source 43, with the output voltage of the thermistor SM being applied as the temperature detection signal Vi to an output conversion circuit 80. The thermistor output voltage increases in accordance with increasing temperature, as illustrated by the thermistor temperature variation characteristic shown in FIG. 10. The output conversion circuit 80 is configured to appropriately adjust the slope of the thermistor temperature variation characteristic, without inverting the slope direction, for thereby obtaining a requisite temperature variation characteristic for the analog circuit output signal Vo.

The output conversion circuit 80 includes an operational amplifier 81, with a resistor 82 connected between its output terminal and inverting input terminal to apply negative feedback. A reference DC voltage Vref from a voltage source 84 is applied to a resistive voltage divider formed of resistors 85 and 86, with the resultant voltage appearing at the junction of resistors 85, 86 being applied via a resistor 83 to the inverting input terminal of the operational amplifier 81.

Designating the resistance values of the resistors 82, 83, 85, 86 as R1, R2, R3 and R4 respectively, the levels of the analog circuit output signal Vo and the temperature detection signal Vi are related as follows:

$$Vo=Vi \times \{(R1+R2)/(R2)\} - Vref \times R1/R2 \times \{R4/(R3+R4)\}$$

Hence, the temperature characteristic slope of the analog circuit output signal Vo (rate of variation Vo with respect to changes in the temperature detection signal Vi) can be adjusted by adjusting the values of the resistors R1, R2, while the amount of DC offset applied to Vo can be adjusted by adjusting the values of the resistors R3 and R4.

Thus with the fifth embodiment, in addition to the effects (1) to (6) obtained with the first embodiment as described above, the following additional effect is obtained:

(10) A resistor 82 is connected between the output terminal and inverting input terminal of the operational amplifier 81 to apply negative feedback, while the temperature detection signal Vi is applied to the non-inverting input terminal of the operational amplifier 81, and a voltage resulting from voltage division of the reference voltage Vref by a voltage divider formed of the resistors 85, 87 is applied via the resistor 83 to the inverting input terminal of the operational amplifier 81. As a result, the output voltage from the thermistor SM, which constitutes the temperature detection signal Vi with this embodiment, can be appropriately converted to form the analog circuit output signal Vo.

Sixth Embodiment

Figure 11:
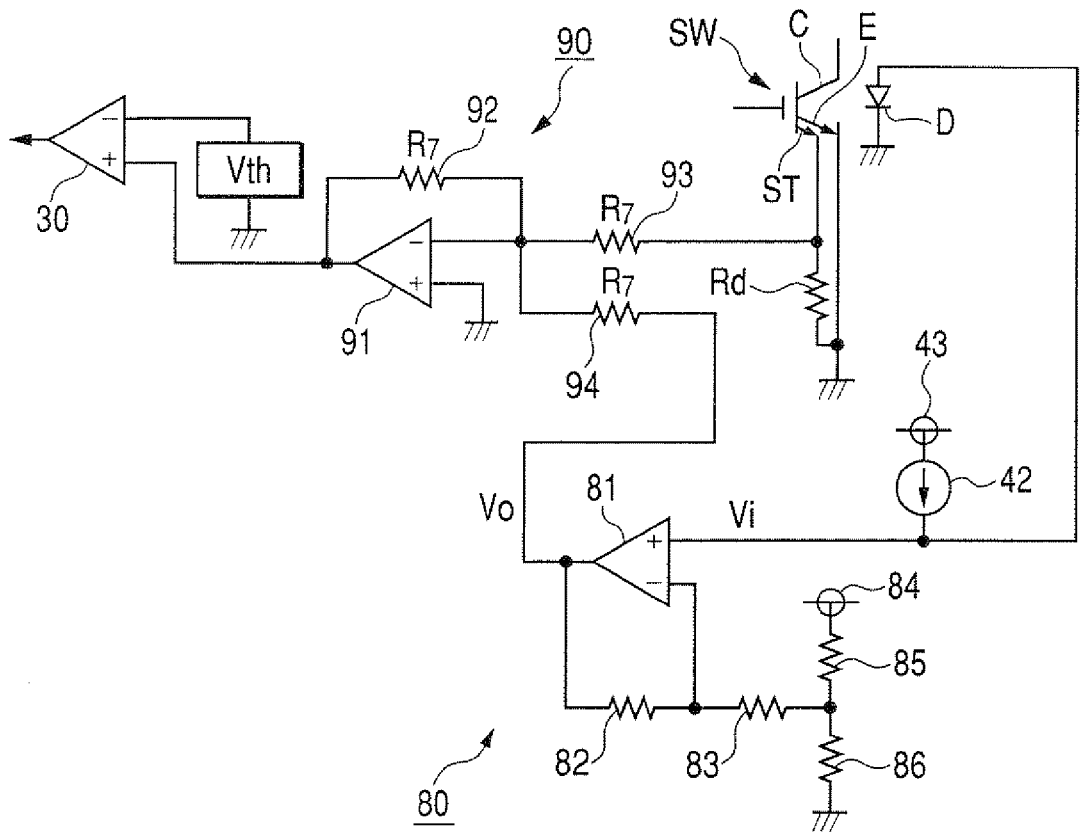
FIG. 11 is a circuit diagram of a sixth embodiment of an overcurrent detection circuit.

A sixth embodiment will be described in the following referring to the circuit diagram of FIG. 11, which shows an overcurrent detection circuit that is representative of each of respective overcurrent detection circuits incorporated in the protection circuits PC1 to PC6. The description is centered on the points of difference from the first embodiment described above. In FIG. 11, components corresponding to components shown in FIG. 9 described above are designated by corresponding reference numerals to those of FIG. 9.

This embodiment differs from each of the preceding embodiments in that the threshold voltage of the comparator 30 is set at a predetermined fixed value Vth, determined in accordance with the maximum permissible level of switched current of the switching element SW, and applied to the inverting input terminal of the comparator 30 as shown.

This embodiment further differs from the preceding embodiments in that a adder circuit 90 combines the voltage drop across the resistor Rd with the analog circuit output signal Vo from the output conversion circuit 80, to obtain a temperature-compensated voltage drop which varies in accordance with the level of switched current of the switching element SW, but which is substantially unaffected by changes in temperature of the switching element SW.

This is achieved by summing the analog circuit output signal Vo and the current detection voltage drop across resistor Rd, in the adder circuit 90, with the resultant temperature-compensated voltage drop being applied to the non-inverting input terminal of the comparator 30, to be compared with the fixed threshold value Vth.

Hence the fixed threshold value Vth can be compared with a value which is correlated with the level of switched current flowing in the switching element SW, but which is substantially unaffected by changes in temperature of the switching element SW.

The adder circuit 90 is made up of an operational IS amplifier 91, having a resistor 92 connected between its output and inverting input terminal to apply negative feedback, and a pair of resistors 93, 94 each having one terminal connected to the non-inverting input terminal of the operational amplifier 91. The other terminal of the resistor 93 is connected to receive the voltage drop across the resistor Rd, while the other terminal of the resistor 93 is connected to receive the analog circuit output signal Vo from the output conversion circuit 80. The non-inverting input terminal of the operational amplifier 91 is connected to the same potential as the emitter of the switching element SW, i.e., the reference ground potential of the corresponding protection circuit as described above.

The resistors 92, 93 and 94 have identical resistance values, so that the value of the output signal from the adder circuit 90 is the sum of the voltage drop across the resistor Rd and the value of the analog circuit output signal Vo, multiplied by −1.

Figure 12:
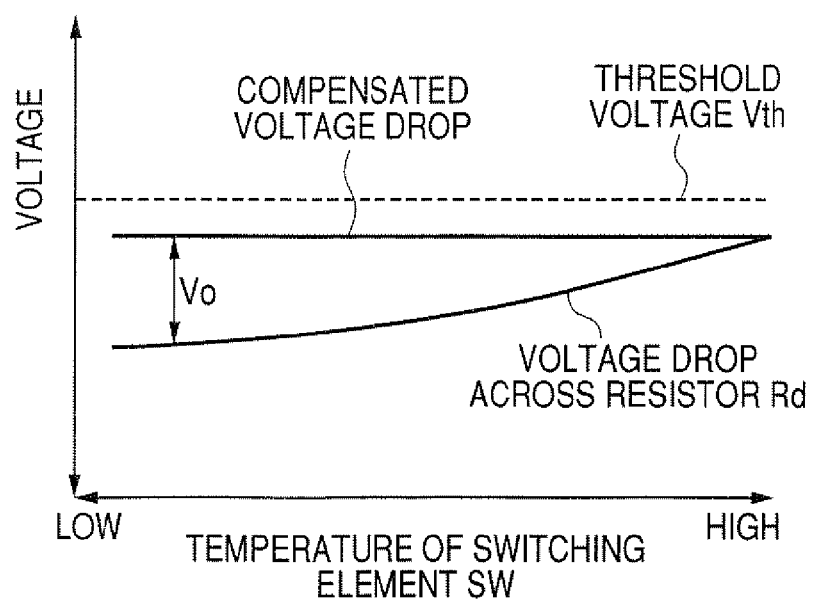
FIG. 12 is a graph illustrating the respective voltage/temperature characteristics of a voltage drop that is indicative of the level of current flow through a switching element and of a temperature-compensated comparison signal, in the sixth embodiment.

The above points are illustrated in FIG. 12, in which the output signal produced from the adder circuit 90 as described above is designated as Vo'. As shown, as the temperature of the switching element SW increases from a low to a high value while the switched current through the switching element SW is at a constant level, so that the voltage drop across the resistor Rd successively increases, the analog circuit output signal Vo successively decreases in accordance with the increasing temperature. The temperature characteristic of Vo is adjusted (by adjusting resistor values in the output conversion circuit 80, essentially as described for the preceding embodiment of FIG. 9) such that the sum of Vo and the voltage drop across the resistor Rd will remain substantially constant as the temperature increases. Thus, the output signal Vo' from the adder circuit 90 remains constant irrespective of the temperature variation of the switching element SW.

Hence, reliable judgement can be made as to whether the level of current through the switching element SW exceeds a predetermined threshold value, by comparing the temperature-compensated voltage drop produced from the adder circuit 90 with the fixed threshold voltage Vth.

Thus with the sixth embodiment, similar effects can be obtained to those for the first embodiment described above.

Seventh Embodiment

Figure 13:
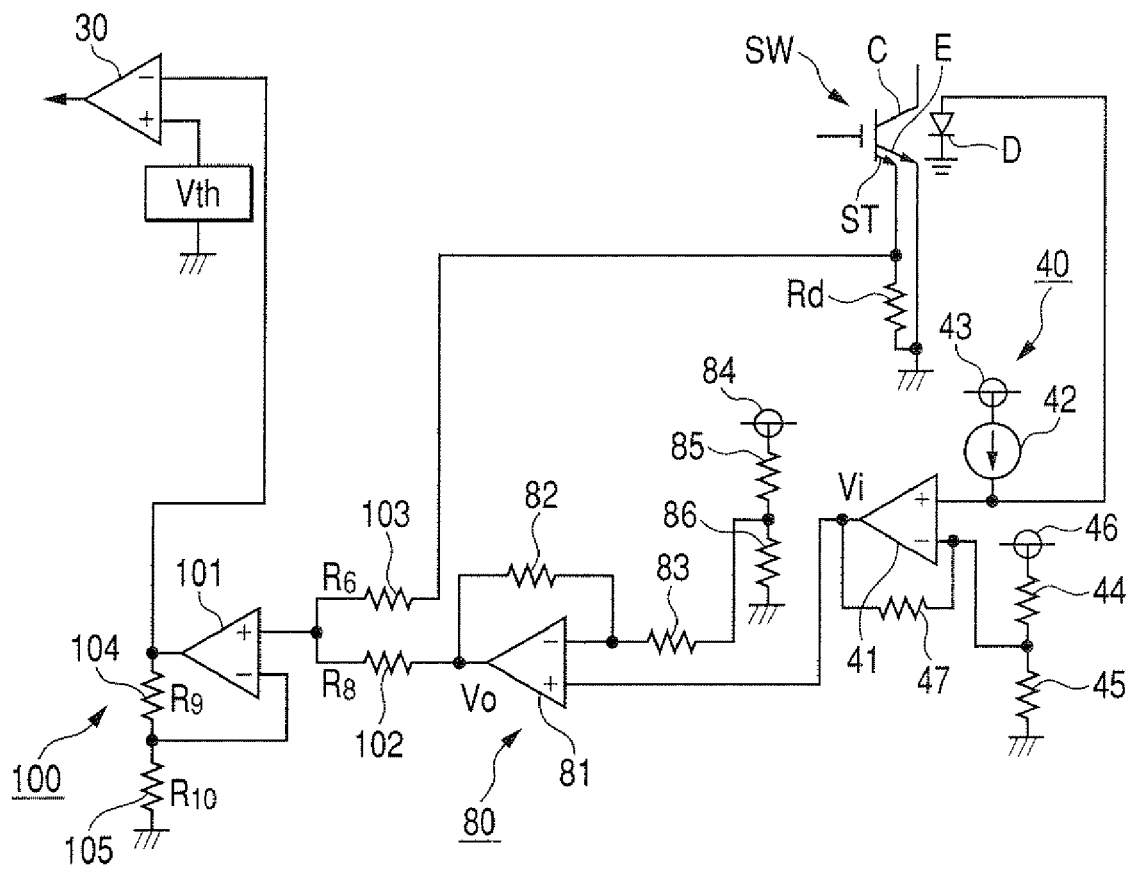
FIG. 13 is a circuit diagram of a seventh embodiment of an overcurrent detection circuit.

A seventh embodiment will be described in the following referring to the circuit diagram of FIG. 13, which shows an overcurrent detection circuit that is representative of each of respective overcurrent detection circuits incorporated in the protection circuits PC1 to PC6. The description is centered on the points of difference from the first embodiment. In FIG. 13, components corresponding to components shown in FIG. 2 and FIG. 9 are designated by corresponding reference numerals to those of FIGS. 2 and 9.

As shown in FIG. 13, the temperature detection signal Vi from the gain adjustment circuit 40 is applied to the non-inverting input terminal of an operational amplifier 81 in the output conversion circuit 80, with the output conversion circuit 80 functioning as a non-inverting amplifier circuit. The output voltage from the output conversion circuit 80 and the voltage drop across the resistor Rd are respectively applied via resistors 102 and 103 to the non-inverting input terminal of an operational amplifier 101 in a non-inverting adder circuit 100. The output terminal of the operational amplifier 101 is connected to the emitter potential of the switching element SW (indicated as ground potential, as described above) via series-connected resistors 104, 105, and the junction of these resistors is connected to the inverting input terminal of the operational amplifier 101.

The resistors 102 and 103 have identical resistance values, designated as R8, so that the output voltage from the non-inverting adder circuit 100 is determined by the sum of the voltage drop across the resistor Rd and the output signal (voltage) from the output conversion circuit 80. Designating the values of the resistors 104, 105 as R9, R10 respectively, the output voltage from the non-inverting adder circuit 100 is obtained as one half of the sum of the voltage drop across the resistor Rd and the output voltage from the output conversion circuit 80 (level of the analog circuit output signal Vo), multiplied by the factor (R9+R10)/R10.

Hence while the current which flows through the switching element SW is constant, the output voltage from the non-inverting adder circuit 100 will be constant, irrespective of variations in temperature.

That is to say, whereas as described in FIG. 3 above, the voltage drop across the resistor Rd increases in accordance with increasing temperature, the voltage across the temperature sensing diode D decreases as the temperature increases. The output voltage from the output conversion circuit 80 can be adjusted by adjusting the values of the resistors 82, 83, 85 and 86 in a manner whereby the rate of reduction of the output voltage from the output conversion circuit 80 with increasing temperature will be appropriate, i.e., whereby accurate compensation can be applied for increases in the voltage drop across the resistor Rd due to increasing temperature, by ensuring that the respective voltage/temperature characteristics will mutually cancel.

Figure 14:
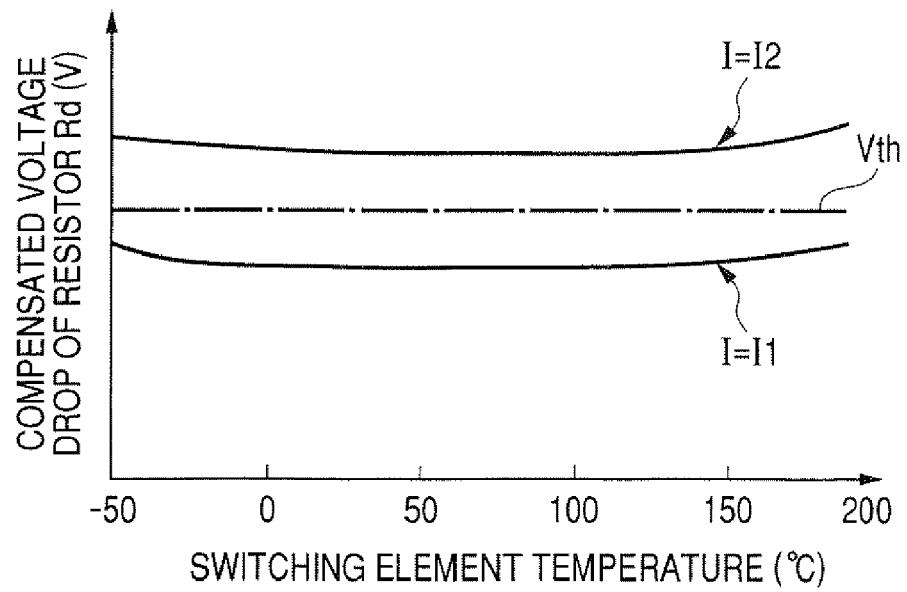
FIG. 14 is a graph showing examples of voltage/temperature characteristics of a temperature-compensated comparison signal from a non-inverting amplifier circuit, in the seventh embodiment.

The output signal from the non-inverting adder circuit 100 is applied to the inverting input terminal of the comparator 30, while a fixed threshold value Vth is applied to the non-inverting input terminal of the comparator 30. Thus with this embodiment as illustrated in FIG. 14, if the temperature of the switching element SW varies while the level of current flowing between the collector and emitter of the switching element is constant, the difference between the threshold voltage Vth and the temperature-compensated voltage drop produced from the non-inverting adder circuit 100 will remain substantially constant. In FIG. 14, the two full-line characteristics respectively show the variation of the output voltage from the non-inverting adder circuit 100 with temperature for the case of the switching element current values i1 and i2, for which corresponding voltage drop characteristics are shown in FIG. 3 described above.

With this embodiment, in addition to the effects (4) to (6) obtained with the first embodiment as described above, the following effects are obtained:

(11) The judgement as to whether the level of current through the switching element SW exceeds a predetermined threshold value is made by comparing the voltage drop across the resistor Rd, temperature-compensated by the analog circuit output signal Vo from the output conversion circuit 80, with a fixed threshold voltage Vth. Hence, effective compensation can be applied for the effects of the temperature dependency of the voltage drop across the resistor Rd.

(12) A voltage that results from summing the voltage drop across the resistor Rd and the output voltage from the output conversion circuit 80 is compared with a fixed predetermined value (the threshold voltage Vth). The compensation applied by the output conversion circuit 80 to the voltage drop across the resistor Rd is achieved by configuring the output conversion circuit 80 to have an output voltage/temperature characteristic whereby the output voltage falls appropriately in accordance with increases in temperature of the switching element SW. Accurate comparator for the temperature dependency of the voltage drop across the resistor Rd can thereby be achieved.

(13) The output voltage from the output conversion circuit 80 and the voltage drop across the resistor Rd are appropriately summed by utilizing the non-inverting adder circuit 100.

Eighth Embodiment

Figure 15:
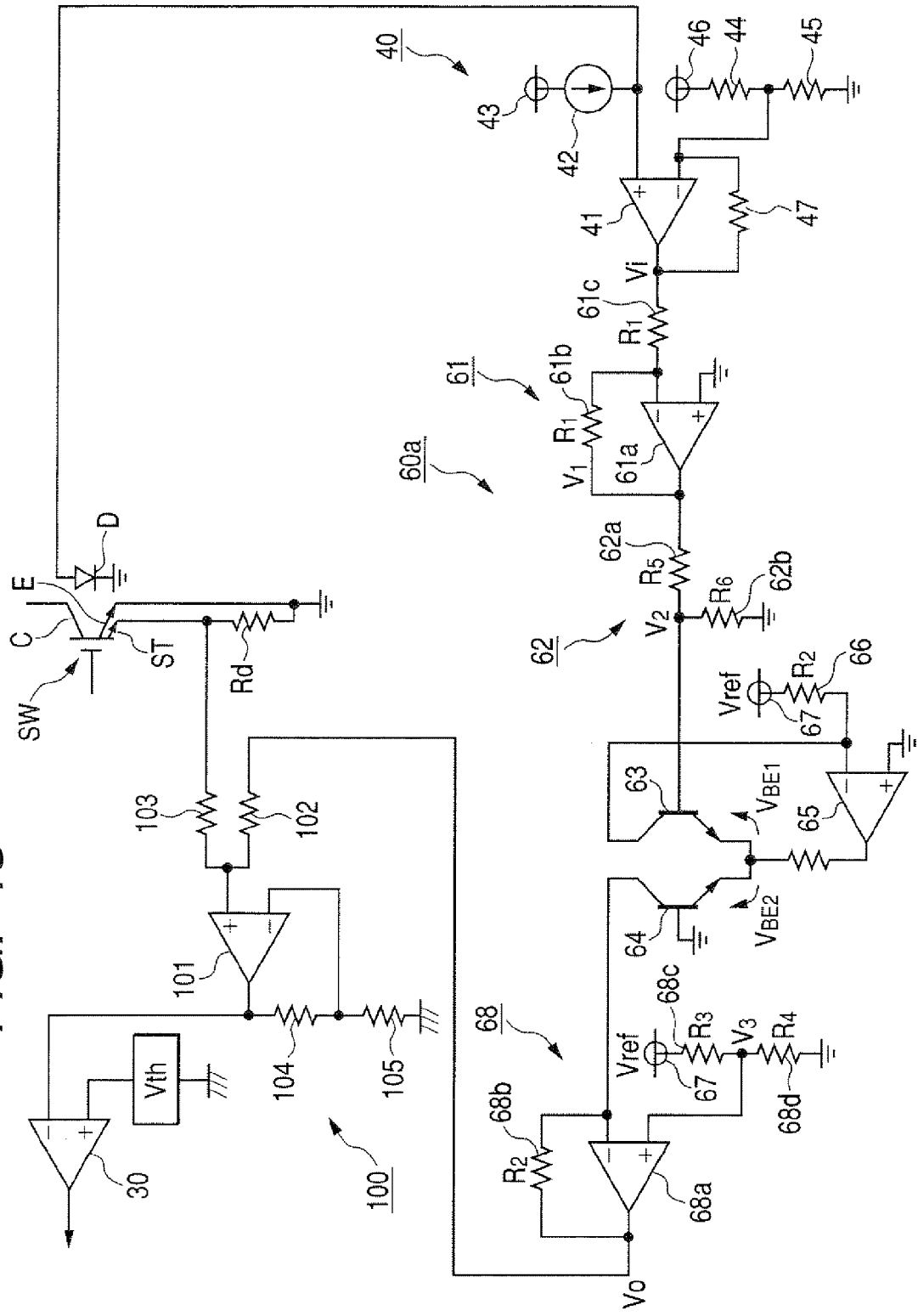
FIG. 15 is a circuit diagram of an eighth embodiment of an overcurrent detection circuit.

An eighth embodiment will be described referring to the circuit diagram of FIG. 15, which shows an overcurrent detection circuit that is representative of each of respective overcurrent detection circuits incorporated in the protection circuits PC1 to PC6. The description is centered on the points of difference from the seventh embodiment described above. In FIG. 15, components corresponding to components shown in FIG. 5 and FIG. 13 above are designated by corresponding reference numerals to those of FIGS. 5 and 13.

With this embodiment, an output conversion circuit 60$a$ is incorporated, which corresponds to the output conversion circuit 60 of FIG. 5, with the addition of an output inverter circuit 61. The output inverter circuit 61 is formed of an operational amplifier 61$a$ having a resistor 61$b$ connected between its output terminal and inverting input terminal, and a resistor 61$c$ that is connected to its inverting input terminal. The temperature detection signal Vi from the gain adjustment circuit 40 is applied via the resistor 61$c$ to that inverting input terminal. Each of the resistors 61$b$, 61$c$ have the same resistor value R1, and the non-inverting input terminal of the operational amplifier 61 is connected to the same potential as the emitter of the switching element SW (indicated as ground potential, as described above). The level of the output signal V2 from the output inverter circuit 61 is therefore equal to the level of the temperature detection signal Vi multiplied by $-1$, and this is applied via the voltage divider 62 to the base of the bipolar transistor 63.

As a result, whereas as described hereinabove for the second embodiment shown in to FIG. 5, the relationship [Vo=Vref×$10^{-Vi}$+V3] is obtained for the analog circuit output signal Vo from the output conversion circuit 60, with this embodiment the level of the analog circuit output signal Vo is equal to Vref×$10^{Vi}$+V3. Thus, Vo increases exponentially in accordance with increase in level of the temperature detection signal Vi, and so decreases exponentially in accordance with increase in temperature of the switching element SW. Hence with the eighth embodiment, if the voltage drop across the resistor Rd increases non-linearly with increasing temperature (as illustrated in FIG. 3), the analog circuit output signal Vo can be applied to accurately compensate for that temperature dependency of the voltage drop across Rd.

In the same way as for the seventh embodiment above, the analog circuit output signal Vo and the voltage drop across the resistor Rd are summed by being respectively applied to resistors 102, 103 of the non-inverting adder circuit 100. The resultant temperature-compensated voltage drop produced from the non-inverting adder circuit 100 is applied to the non-inverting input terminal of the comparator 30, while the fixed threshold voltage Vth is applied to the non-inverting input terminal, as described for the seventh embodiment.

Thus with this embodiment, in addition to the effects (11) to (13) obtained with the seventh embodiment as described above, the following effect is obtained:

(14) By utilizing the output conversion circuit 60a, which performs exponential conversion of the output voltage from the temperature sensing diode D, to obtain a voltage that is applied to compensate for the temperature dependency of the voltage drop of the resistor Rd, effective compensation can be achieved when the voltage/temperature characteristic of the voltage drop is non-linear. As a result, accurate comparison with the threshold value Vth can be achieved, irrespective of variations in temperature of the switching element SW.

Ninth Embodiment

A ninth embodiment will be described referring to the circuit diagram of FIG. 16, which shows an overcurrent detection circuit for a pair of switching elements SWa, SWb that is representative of each of the overcurrent detection circuits PC to PC6 provided for pairs of switching elements SW1a, SW1b, etc., i.e., it is assumed that the system of FIG. 6 is utilized, with each of the switching elements of FIG. 1 being replaced by a pair of switching elements. The description of the ninth embodiment is centered on the points of difference from the seventh embodiment above.

Figure 16:
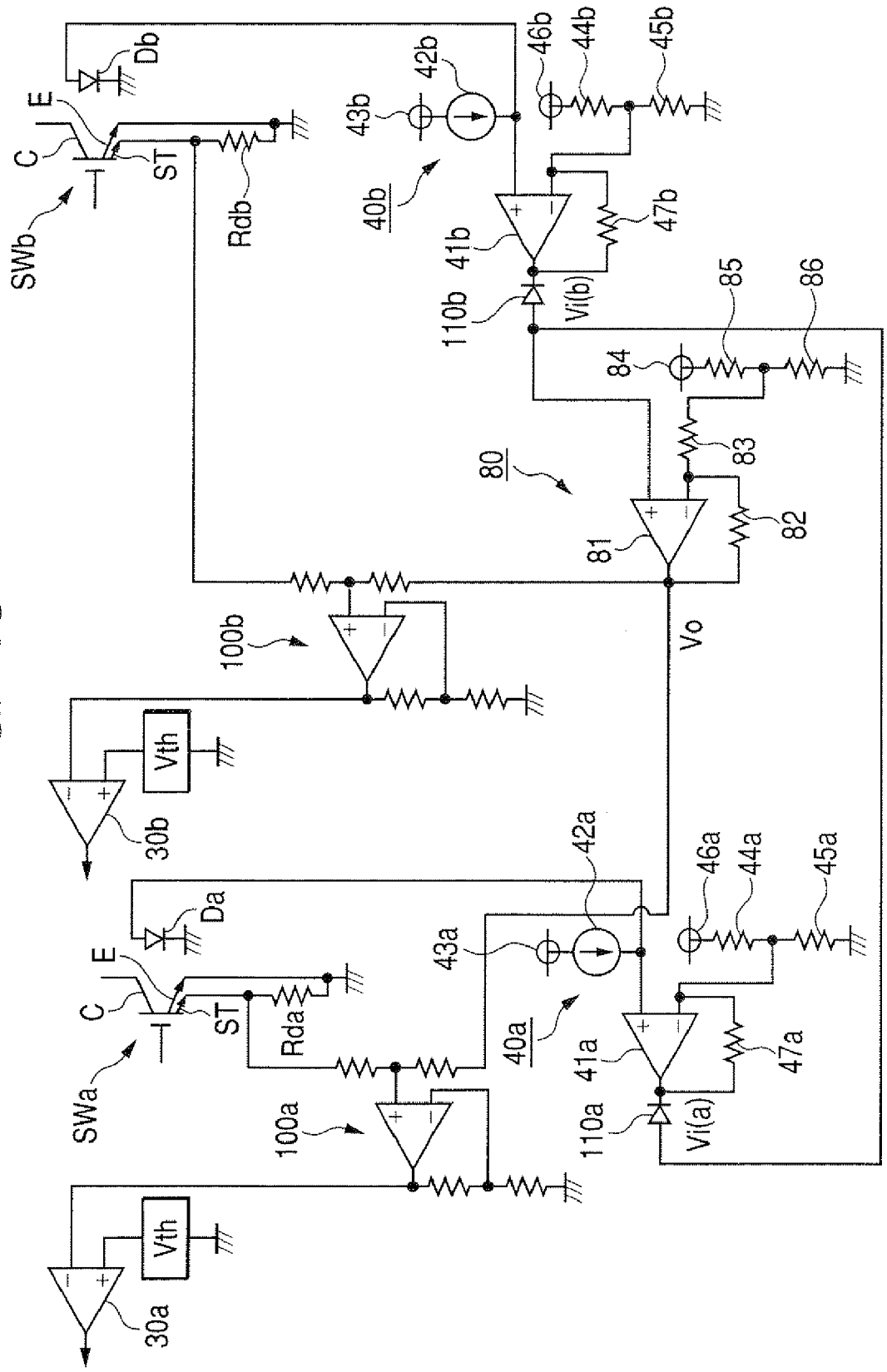
FIG. 16 is a circuit diagram of a ninth embodiment of an overcurrent detection circuit.

In FIG. 16, components corresponding to components shown in FIG. 7 and FIG. 13 are designated by corresponding reference numerals to those of FIGS. 7 and 13. A pair of temperature sensing diodes Da, Db are respectively located close to the switching elements SWa, SWb. The switching elements SWa, SWb are assumed to have identical characteristics (i.e., identical dimensions, configuration, accuracy of manufacture, performance, etc.), and the temperature sensing diodes Da, Db are similarly assumed to have identical characteristics.

In FIG. 16, the output signals from the temperature sensing diodes Da, Db are inputted to respective gain adjustment circuits 40a, 40b, having identical circuit characteristics and each being of identical configuration to that described above for the gain adjustment circuit 40 of FIG. 2. Respective temperature detection signals Vi(a), Vi(b) from the gain adjustment amplifiers 40a, 40b are supplied to the output conversion circuit 80 via diodes 110a, 110b. The cathode of each of these diodes is connected to the output of the corresponding one of the gain adjustment amplifiers 40a, 40b, while the anode of each diode is connected to the non-inverting input terminal of the operational amplifier 81 in the output conversion circuit 80. The analog circuit output signal Vo produced from the output conversion circuit 80 is inputted to each of two non-inverting adder circuits 100a and 100b, while the voltage drop across the resistor Rda of switching element SWa and the voltage drop across the resistor Rdb of switching element SWb are respectively inputted to the non-inverting adder circuits 100a and 100b.

The non-inverting adder circuit 100a sums the voltage drop across the resistor Rda and the analog circuit output signal Vo, while the non-inverting adder circuit 100b similarly sums the voltage drop across the resistor Rdb and the analog circuit output signal Vo. The comparator 30a compares the magnitude of the output voltage from the non-inverting adder circuit 100a with the fixed threshold voltage Vth, while similarly the comparator 30b compares the magnitude of the output voltage from the non-inverting adder circuit 100b with the threshold voltage Vth.

Thus with this configuration, the output conversion circuit 80 is utilized in common for both the switching elements SWa, SWb.

Furthermore with this embodiment, the output conversion circuit 80 acquires the temperature sensing signal from the one of the temperature sensing diodes Da, Db that is at the lower temperature of the two diodes. As described above referring to FIG. 4, the lower the temperature, the lower will be the output voltage from a temperature sensing diode Da or Db. Thus as a result of the higher of the one of the output voltages from the temperature sensing diodes Da, Db being selected, the output voltage from the temperature sensing diode which is at the lower temperature will be selected for conversion to obtain the analog circuit output signal Vo. Hence, comparison with the threshold voltage Vth is performed based on the output voltage from the temperature sensing diode which is at the lower temperature. A reliable judgement can thereby be made as to whether the level of current flowing in one or both of the switching elements SWa, SWb exceeds the threshold value.

With this embodiment, the effects of the seventh embodiment and also of the third embodiment are obtained.

Tenth Embodiment

Figure 17:
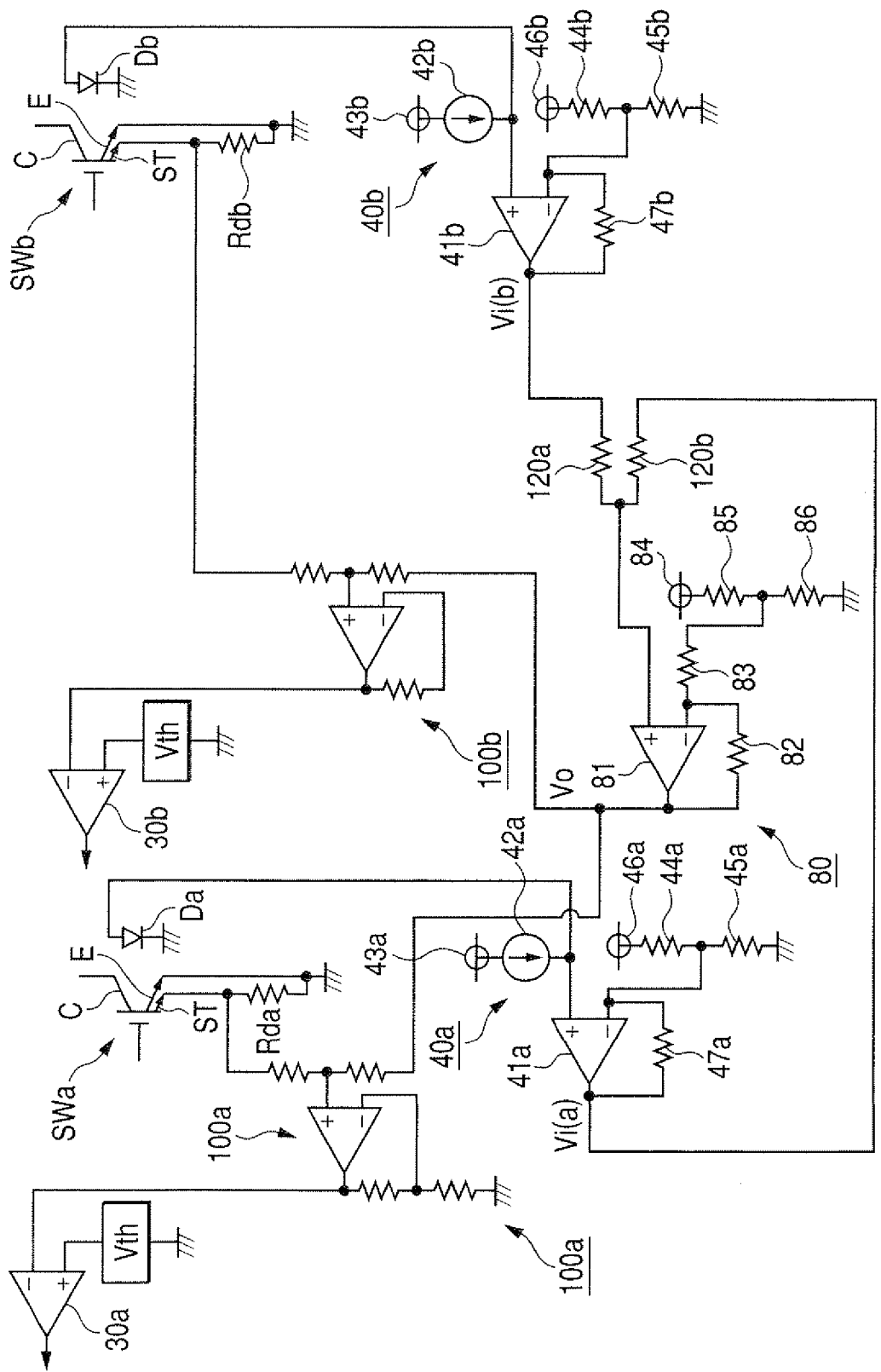
FIG. 17 is a circuit diagram of a tenth embodiment of an overcurrent detection circuit.

A tenth embodiment will be described, with the description being centered on the points of difference from the ninth embodiment described above. Similarly to the ninth embodiment, the tenth embodiment assumes the use of the system of FIG. 6, with single switching elements replaced by pairs of switching elements. The circuit diagram of FIG. 17 shows an overcurrent detection circuit that is representative of each of respective overcurrent detection circuits of this embodiment, incorporated in the protection circuits PC1 to PC6 of the respective pairs of switching elements. In FIG. 17, components corresponding to components shown in FIG. 8 and FIG. 13 are designated by corresponding reference numerals to those of FIGS. 8 and 13.

The output signals from the temperature sensing diodes Da, Db respectively located close to the switching elements SWa, SWb are inputted to the gain adjustment amplifiers 40a, 40b respectively. The gain adjustment amplifiers 40a, 40b have identical specifications, and each has the same configuration as the gain adjustment circuit 40 of FIG. 2 described above. The temperature detection signals Vi(a), Vi(b) produced from the gain adjustment amplifiers 40a, 40b are respectively inputted through resistors 120a and 120b to the output conversion circuit 80, so that the analog circuit output signal Vo of this embodiment is derived based on the average of the temperature detection signals Vi(a). Vi(b), i.e., based on the average of the temperatures of the temperature sensing diodes Da and Db. In other respects, the operation and configuration of this embodiment are identical to those of the ninth embodiment above.

It can thus be understood that with this embodiment, the output conversion circuit 80 is utilized in common for conversion of temperature detection signals corresponding to both of the switching elements SWa, SWb, for obtain the analog circuit output signal Vo, as for output conversion circuit 50 of the fourth embodiment.

Eleventh Embodiment

Figure 18:
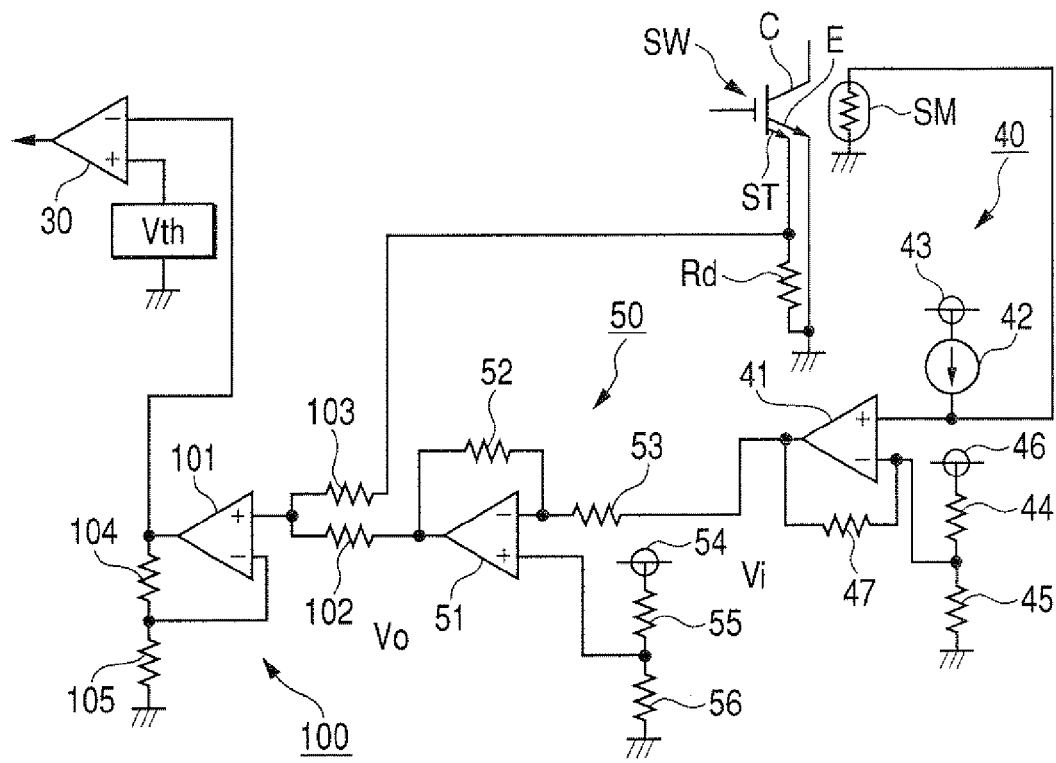
FIG. 18 is a circuit diagram of eleventh embodiment of an overcurrent detection circuit.

An eleventh embodiment will be described referring to the circuit diagram of FIG. 18, which shows an overcurrent detection circuit that is representative of each of respective overcurrent detection circuits incorporated in the protection circuits PC1 to PC6 shown in FIG. 1. The description is centered on the points of difference from the seventh embodiment described above, shown in FIG. 13. In FIG. 18, components corresponding to components shown in FIG. 2 described above are designated by corresponding reference numerals to those of FIG. 2.

Figure 10:
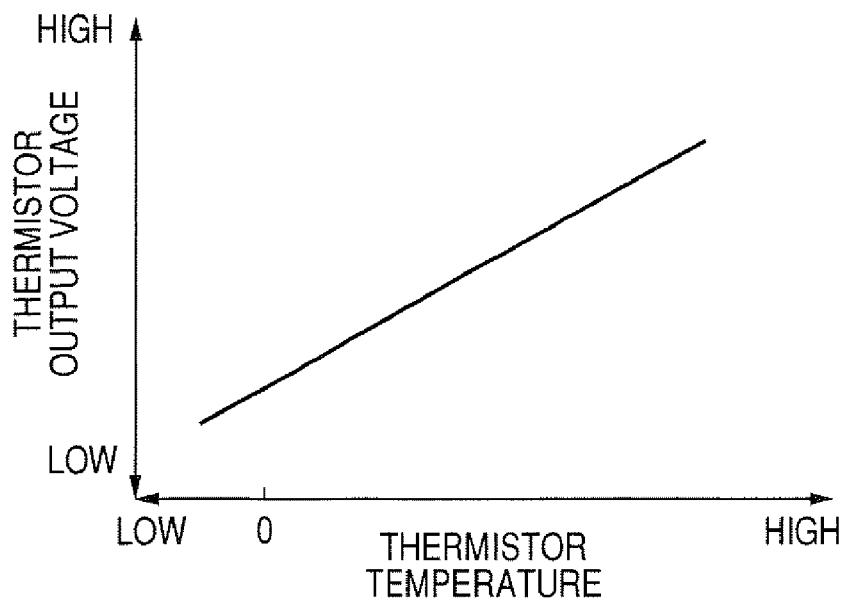
FIG. 10 is a graph illustrating the form of voltage/temperature characteristic of a thermistor that is used to detect the temperature of a switching element with the fifth embodiment.

With this embodiment a thermistor SM detects the temperature of the switching element SW, as for the fifth embodiment described above shown in FIG. 9. The output voltage from the thermistor SM is inputted via the gain adjustment circuit 40 to the output conversion circuit 50, which is an inverting amplifier circuit. The resultant analog circuit output signal Vo from the output conversion circuit 50 and the voltage drop of the temperature sensing diode Rd are summed by the non-inverting adder circuit 100. As shown in FIG. 10, the output voltage from the thermistor SM increases with increasing temperature, and these changes in the output voltage from the thermistor SM are inverted by the output conversion circuit 50. Hence, the analog circuit output signal Vo varies with temperature in the opposite direction to the voltage drop across the resistor Rd, so that output voltage from the non-inverting adder circuit 100 is compensated against the temperature dependency of the voltage drop across Rd, by being summed with the analog circuit output signal Vo. The respective configurations of the gain adjustment circuit 40 and the output conversion circuit 50 are as described for the embodiment of FIG. 2 described above.

This embodiment provides the same effects as the seventh embodiment described above.

Twelfth Embodiment

A twelfth embodiment will be described referring to the circuit diagram of FIG. 19, which shows an overcurrent detection circuit that is representative of each of respective overcurrent detection circuits incorporated in the protection circuits PC1 to PC6, with the description being centered on the points of difference from the seventh embodiment. In FIG. 10, components corresponding to components shown in FIG. 2 are designated by corresponding reference numerals to those of FIG. 2.

With this embodiment the voltage of the temperature sensing diode D, outputted as the temperature detection signal Vi from the gain adjustment circuit 40, is inputted to the output conversion circuit 50, which is an inverting amplifier circuit as for the preceding embodiment. The analog circuit output signal Vo thereby produced from the output conversion circuit 50 and the voltage drop across the resistor Rd are each inputted to a subtractor circuit 130, which is based on an operational amplifier 131. A resistor 132 is connected between the output terminal and inverting input terminal of the operational amplifier 131, with the output signal Vo from the output conversion circuit 50 being applied via the resistor 133 to that inverting input terminal. The non-inverting input terminal of the operational amplifier 131 is connected through a resistor 134 to the emitter potential of the switching element SW (indicated as ground potential in the drawings, as described above), and is also connected through the resistor 135 to the voltage drop across the resistor Rd.

With this configuration, assuming that each of the resistors 132, 133, 134, 135 each have the same value R11, the output voltage from the subtractor circuit 130 is the difference between the output voltage of the output conversion circuit 50 (the level of the analog circuit output signal Vo) and the voltage drop across the resistor Rd. Hence, since Vo increases in accordance with increasing temperature, an increase in the voltage drop across the resistor Rd that result from increasing temperature is compensated (cancelled) by subtraction of a corresponding increase in the level of Vo. The comparator 30 thereby compares the fixed threshold voltage Vth with the magnitude of a voltage (output from the subtractor circuit 130) which is compensated against the effects of temperature variations of the switching element SW.

With this embodiment, in addition to the effects obtained with the first embodiment as described above, the following effects are obtained:

(15) The judgement as to whether the switched current of the switching element SW exceeds a predetermined threshold value is made based upon comparing a fixed voltage threshold value with the difference between the level of the analog circuit output signal Vo and the voltage drop across the resistor Rd, which vary with temperature in mutually opposite directions. Hence, compensation for the temperature dependency of the voltage drop across the resistor Rd can be achieved, enabling accurate judgement to be performed.

Other Embodiments

The above embodiments could be modified in various ways, as described for example in the following.

(1) With the second embodiment (FIG. 5), the values R5, R6 of the resistors 62a, 62b are adjusted to establish the relationship $\alpha = R6/(R5+R6)$. However it is not essential that such a method of setting be employed. With that embodiment, the level of the analog circuit output signal Vo is proportional to $10^{[-Vi \times R6/\{(R5+R6) \times \alpha\}]}$. Hence, it would be possible to set the respective values of the resistors 62a, 62b such as to adjust the rate at which the analog circuit output signal Vo increases with respect to increasing temperature of the switching element SW, and so obtain a temperature characteristic for Vo that is closer to a required optimum characteristic.

Figure 20:
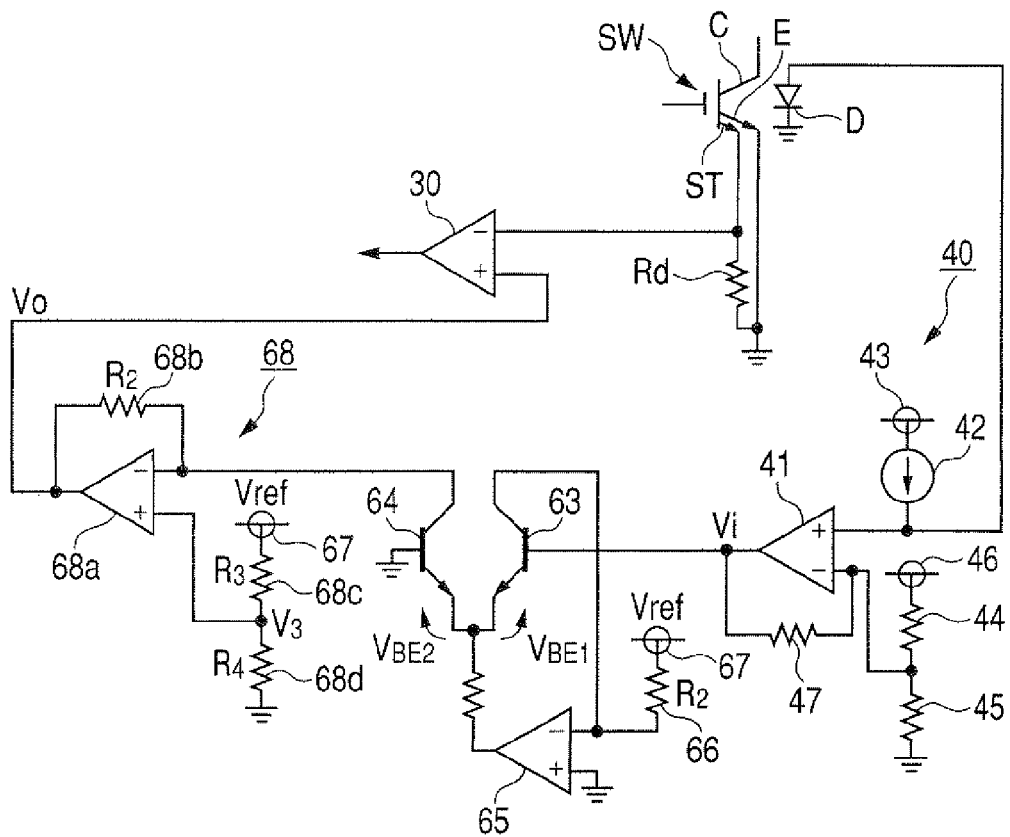
FIG. 20 is a circuit diagram of a modified version of the second embodiment.

(2) Alternative circuit configurations to that of FIG. 5 can be envisaged, for converting the voltage/temperature characteristic of the temperature sensing diode D to an exponentially varying characteristic, to derive the analog circuit output signal Vo. For example as shown in the alternative circuit configuration of FIG. 20, the voltage divider 62 of FIG. 5 may be omitted. In FIG. 20, components corresponding to components shown in FIG. 5 are designated by corresponding reference numerals to those of FIG. 5. In this case, the value of the analog circuit output signal Vo is obtained as the sum of a term which is proportional to $10^{(-Vi/\alpha)}$ and a constant term that is determined by the value of Vref.

(3) The sixth embodiment (FIG. 11) could be modified such that the analog circuit output signal Vo is produced from the output conversion circuit 60 shown in FIG. 20. Furthermore with the sixth embodiment, it would be possible to use the thermistor M in conjunction with the output conversion circuit 50 shown in FIG. 2.

Figure 21:
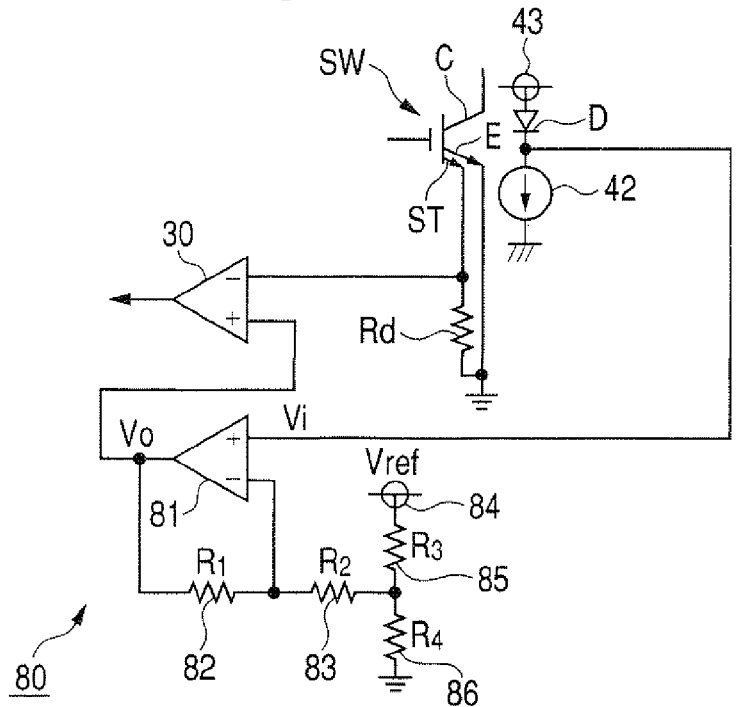
FIG. 21 is a circuit diagram of a modified version of the first embodiment.

(4) With several of the embodiments described above, an inverting amplifier circuit is used to invert the temperature detection signal Vi, however other arrangements for inverting that signal could be envisaged. For example as shown in FIG. 21, instead of using an inverting amplifier circuit, it would be possible to invert the polarity of the output voltage from the temperature sensing diode D, by connecting the diode D between the power source 43 and the constant-current source 42. In FIG. 21, components corresponding to components shown in FIG. 9 are designated by corresponding reference numerals to those of FIG. 9.

(5) With the fifth embodiment (FIGS. 9 and 10), it would be equally possible to use the output conversion circuit 60 shown in FIG. 15 (eighth embodiment), in place of the output conversion circuit 80.

(6) With the sixth embodiment of FIG. 11, it would be equally possible to use the output voltage from the output conversion circuit 60 shown in FIG. 5 (second embodiment) as the input signal to the non-inverting adder circuit 100.

Figure 19:
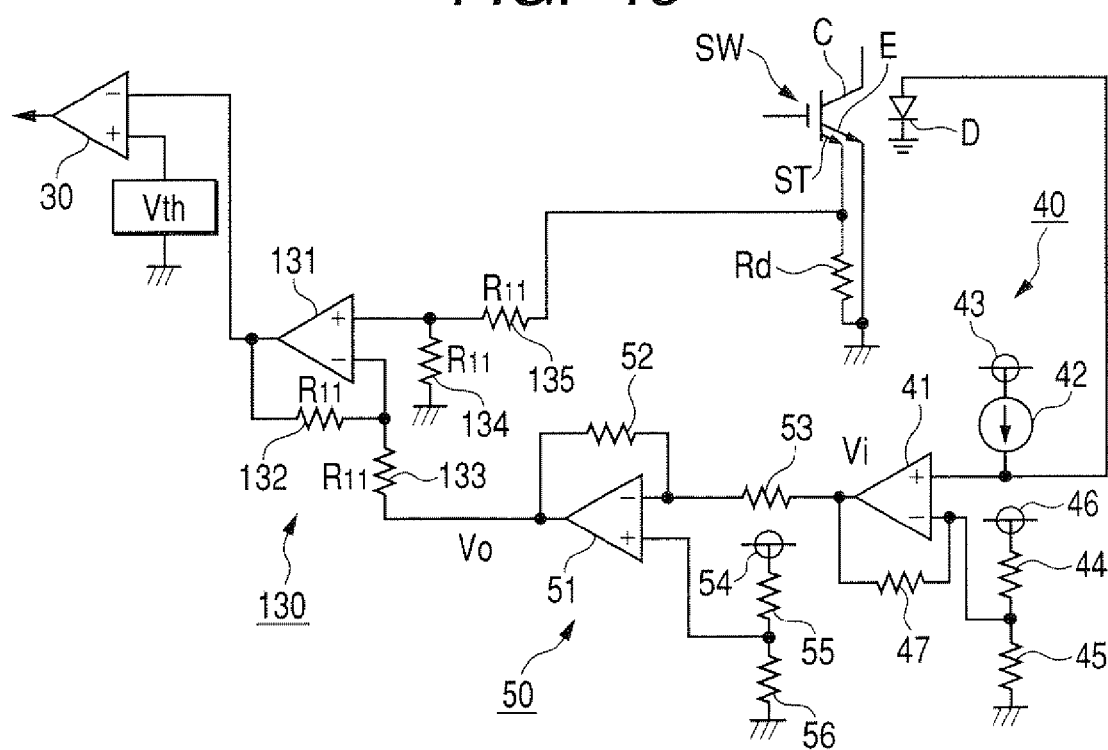
FIG. 19 is a circuit diagram of a twelfth embodiment of an overcurrent detection circuit.

(7) With the twelfth embodiment shown in FIG. 19, it would be equally possible to use the output conversion circuit shown in FIG. 20 in place of the output conversion circuit 50. Alternatively, it would be possible to a thermistor instead of the temperature sensing diode D, in conjunction with the output conversion circuit 80 being used instead of the output conversion circuit 50.

(8) Also with the twelfth embodiment, changes could be made in the values set for the resistors 132 to 135. In that case, it would be possible to derive the temperature-compensated temperature detection signal Vi (from the operational amplifier 131) as the difference between the result of multiplying the level of the analog circuit output signal Vo from the output conversion circuit 50 by a positive factor and the result of multiplying the temperature sensing diode D by a positive factor.

(9) The invention is not limited to the circuit arrangements of the above embodiments for adjusting the slope of the voltage/temperature characteristic and adjusting the offset amount of the analog circuit output signal Vo. For example, in the case of the first embodiment (FIG. 2) it would be possible to apply the output voltage from the output conversion circuit 50 to a resistive voltage divider formed of a pair of resistors, with the values of these resistors being adjusted to adjust the slope and the offset amount, i.e. with the output voltage from the resistive voltage divider constituting the analog circuit output signal Vo.

Furthermore with the fifth embodiment (FIG. 9) it would be possible to similarly perform voltage division of the output voltage of the thermistor SM using a pair of resistors, to adjust the output voltage obtained from the thermistor. In that case, the output conversion circuit 80 shown in FIG. 9 could be replaced by a pair of series-connected resistors, so that the circuit configuration would be simplified.

(10) In each of the circuit configurations shown in FIGS. 2, 5, 7, 8, 13, 15, 16, 17, 18, 19 and 20, it would be possible to use only the constant current sources 42, 42a, 42b and the voltage sources 43, 43a, 43b, omitting the gain adjustment circuits 40, 40a, i.e., with the temperature detection signal Vi being obtained directly as the voltage drop across a temperature sensing diode in each case.

(11) The invention is not limited to the use of temperature sensing diodes or thermistors as devices for detecting the temperature of each switching element SW. It would be equally possible to utilize other devices, such as thermocouples, etc.

(12) It would be equally possible to utilize devices other than IGBTs as the switching elements, such as MOS transistors, etc.

(13) It is not essential to use the electrical condition quantity of the above embodiments (i.e., level of current which flows from terminal ST of an IGBT) as an electrical type of condition quantity which is correlated with the current that flows between input and output terminals of a switching element. It would be equally possible for example to utilize the level of voltage developed between the collector and emitter of a transistor that is used as a switching element, e.g., as described in reference document 1 above. The essential point is that an electrical type of condition quantity must be utilized having a known form of correlation with the switched current of the switching element, and having a known form of temperature variation characteristic.

Furthermore the invention is not limited in application to switching elements in a power inverter for driving an electric motor, and could for example be applied to the switching elements in a DC-to-DC converter which converts the voltage from a high-voltage battery of a vehicle to a lower voltage for charging a low-voltage battery. In such types of application, in which switching elements are utilized in both a high-voltage system and in a low-voltage system of an apparatus, with the high-voltage and low-voltage systems being electrically insulated from one another, the invention provides the advantage that it is unnecessary to perform communication between the low-voltage system and high-voltage system (for transferring control signals, etc.) to control an overcurrent protection circuit.

The invention thus makes it unnecessary to utilize special devices such as photocouplers for controlling overcurrent protection circuits in such types of application, and the devices utilized as switching elements in the high-voltage system can be of identical type to those of the low-voltage system.

What is claimed is:

1. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein in performing said conversion, said analog circuit modifies a temperature variation characteristic of said temperature detection signal to convert said temperature variation characteristic to a predetermined non-linear form of characteristic.

2. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein in performing said conversion, said analog circuit converts said temperature variation characteristic of said temperature detection signal to an exponential form of characteristic.

3. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein said analog circuit comprises an operational amplifier circuit, and a first resistor connected between an output terminal of said operational amplifier circuit and an inverting input terminal of said operational amplifier circuit for applying negative feedback, wherein said analog circuit output signal is produced from said output terminal of said operational amplifier circuit.

4. An overcurrent detection circuit as claimed in claim 3, wherein said temperature detection signal is applied to a non-inverting input terminal of said operational amplifier circuit.

5. An overcurrent detection circuit as claimed in claim 3 wherein said analog circuit comprises a second resistor, having a first terminal thereof connected to said non-inverting input terminal of said operational amplifier circuit, and wherein said temperature detection signal is applied to a second terminal of said second resistor.

6. An overcurrent detection circuit as claimed in claim 3, comprising second and third resistors connected as a resistive voltage divider across a DC voltage source, with a voltage-divided output from said resistive voltage divider being applied to a non-inverting input terminal of said operational amplifier circuit, wherein said temperature detection signal is applied to said inverting input terminal.

7. An overcurrent detection circuit as claimed in claim 3, comprising second and third resistors connected as a resistive voltage divider across a DC voltage source, and a fourth resistor connected between said non-inverting input terminal and a junction of said second and third resistors, wherein said temperature detection signal is applied to said non-inverting input terminal.

8. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein said analog circuit comprises an exponential conversion circuit having an exponential relationship between variation in a magnitude of an input signal and a corresponding variation of an output signal thereof.

9. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein said analog circuit comprises:

an exponential conversion circuit having an exponential relationship between variation in a magnitude of an input signal and a corresponding variation of an output signal thereof;

first and second transistors having respective emitters thereof connected in common, and an operational amplifier circuit having an output terminal connected to said emitters, with a base of said first transistor connected and a non-inverting input terminal of said operational amplifier connected to a common potential, a collector of said second transistor connected to an inverting input terminal of said operational amplifier, and a resistor connected between a DC voltage source and said inverting input terminal.

10. An overcurrent detection circuit as claimed in claim 9, wherein temperature detection signal is applied to a base of said second transistor, and wherein said analog circuit comprises a second operational amplifier circuit, and a resistor connected between an output terminal of said second operational amplifier circuit and an inverting input terminal of said second operational amplifier circuit, said collector of said first transistor is connected to said inverting input terminal of said second operational amplifier circuit, and said analog circuit output signal is produced from said output terminal of said second operational amplifier circuit.

11. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a plurality of temperature detection circuits adapted to produce a temperature detection signal varying in accordance with a temperature of respective ones of a plurality of switching elements, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein the plurality of temperature detection circuits correspond to the respective ones of the plurality of switching elements, and said analog circuit is adapted to select a temperature detection signal from a one of said temperature detection circuits which corresponds to a one of said switching elements having a lowest temperature of all of said switching elements, and to apply said predetermined conversion to said selected one of the temperature detection signals.

12. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a plurality of temperature detection circuits adapted to produce a temperature detection signal varying in accordance with a temperature of respective ones of a plurality of switching elements, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein the plurality of the temperature detection circuits correspond to the respective ones of the plurality of the switching elements, and said analog circuit is adapted to derive an average temperature detection signal from respective temperature detection signals of said plurality of temperature detection circuits, and to apply said predetermined conversion to said average temperature detection signal.

13. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein each of said analog circuit output signal and said condition detection signal increases in magnitude in accordance with increasing temperature of said switching element, said analog circuit produces said analog circuit output signal with a predetermined amount of offset, and said judgement circuit is adapted to perform said judgement by comparing respective magnitudes of said analog circuit output signal and said condition detection signal.

14. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition Quantity relating to a condition of said switching element, said electrical condition Quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein said analog circuit is adapted to combine said analog circuit output signal with said condition detection signal to obtain a compensated condition detection signal, and wherein said judgement circuit is adapted to perform said judgement by comparing said compensated condition detection signal with a predetermined fixed threshold value.

15. An overcurrent detection circuit as claimed in claim 14, wherein said analog circuit output signal and said output condition detection signal respectively decrease in magnitude and increase in magnitude in accordance with increasing temperature of said switching element, and said analog circuit is adapted to obtain said compensated condition detection signal by summing said condition detection signal from said condition detection circuit and said analog circuit output signal from said analog circuit.

16. An overcurrent detection circuit as claimed in claim 15, wherein said analog circuit comprises a non-inverting amplifier circuit for deriving said analog circuit output signal from said temperature detection signal.

17. An overcurrent detection circuit as claimed in claim 14, wherein each of said analog circuit output signal and said condition detection signal increases in magnitude in accordance with increasing temperature of said switching element, and wherein said analog circuit means is adapted to obtain said compensated condition detection signal by a subtraction operation performed on said condition detection signal and said analog circuit output signal.

18. An overcurrent detection circuit for detecting an overcurrent condition whereby a magnitude of a switched current that flows between input and output terminals of a switching element exceeds a predetermined value, comprising a condition detection circuit adapted to produce a condition detection signal varying in accordance with an electrical condition quantity relating to a condition of said switching element, said electrical condition quantity having a predetermined correlation with said switched current, a temperature detection circuit adapted to produce a temperature detection signal varying in accordance with a temperature of said switching element, an analog circuit adapted to perform a specific analog signal processing operation for conversion of said temperature detection signal to an output signal, and a judgement circuit for performing a comparison operation to compare a magnitude of said condition detection signal with a comparison threshold value, to judge when said overcurrent condition is occurring, while applying said output signal from said analog circuit to compensate said comparison operation against a temperature dependency of said condition detection signal;

wherein said switching element comprises a sensor terminal for outputting a small-magnitude current which varies in magnitude in accordance with said magnitude of said switched current of said switching element, and said condition detection circuit comprises a resistor coupled to receive said small-magnitude current, with a resultant voltage drop across said resistor constituting said output signal from said condition detection circuit.

* * * * *